(12) United States Patent
Hasan et al.

(10) Patent No.: US 10,838,148 B2
(45) Date of Patent: Nov. 17, 2020

(54) METHOD FOR MANUFACTURING A WAVEGUIDE FOR GUIDING AN ELECTRO-MAGNETIC WAVE

(71) Applicants: IMEC VZW, Leuven (BE); KATHOLIEKE UNIVERSITEIT LEUVEN, Leuven (BE)

(72) Inventors: Md Mahmud Ul Hasan, Leuven (BE); Simone Severi, Leuven (BE); Veronique Rochus, Leuven (BE); Wouter Jan Westerveld, Leuven (BE)

(73) Assignees: IMEC VZW, Leuven (BE); KATHOLIEKE UNIVERSITEIT LEUVEN, Leuven (BE)

( * ) Notice: Subject to any disclaimer, the term of this patent is extended or adjusted under 35 U.S.C. 154(b) by 0 days.

(21) Appl. No.: 16/703,650

(22) Filed: Dec. 4, 2019

(65) Prior Publication Data

US 2020/0174192 A1    Jun. 4, 2020

(30) Foreign Application Priority Data

Dec. 4, 2018    (EP) ..................................... 18210105

(51) Int. Cl.
*G02B 6/136* (2006.01)
*C23C 16/455* (2006.01)
*G02B 6/132* (2006.01)
*C23C 16/56* (2006.01)
*G02B 6/12* (2006.01)

(52) U.S. Cl.
CPC ........ *G02B 6/132* (2013.01); *C23C 16/45525* (2013.01); *C23C 16/56* (2013.01); *G02B 6/136* (2013.01); *G02B 2006/12173* (2013.01)

(58) Field of Classification Search
None
See application file for complete search history.

(56) References Cited

U.S. PATENT DOCUMENTS 5,367,585 A    11/1994 Ghezzo et al.
9,696,604 B1 *   7/2017 Lin ........................ G02B 6/136
(Continued)

FOREIGN PATENT DOCUMENTS

CN    101776465 A    7/2010
CN    108761637 A    11/2018

OTHER PUBLICATIONS

Extended European Search Report on patent application No. 18210105.5 dated May 31, 2019.

*Primary Examiner* — Shamim Ahmed
(74) *Attorney, Agent, or Firm* — Moser Taboada

(57) ABSTRACT

A method for manufacturing of a waveguide for guiding an electro-magnetic wave comprising: forming a first waveguide layer, a sacrificial layer and a protection layer on a first wafer, patterning to define a pattern of a first waveguide part and a supporting structure in the first waveguide layer; exposing the sacrificial layer on the first waveguide part while the protection layer still covers the sacrificial layer on the supporting structure; removing the sacrificial layer on the first waveguide part; removing the protection layer; bonding a second wafer to the sacrificial layer of the first wafer such that a second waveguide part is supported by the supporting structure and a gap corresponding to the thickness of the sacrificial layer is formed between the first and second waveguide parts.

14 Claims, 8 Drawing Sheets

(56) References Cited

U.S. PATENT DOCUMENTS

| | | |
|---|---|---|
| 2011/0187868 A1 | 8/2011 | Chang et al. |
| 2013/0294719 A1 | 11/2013 | Stievater et al. |
| 2014/0010253 A1* | 1/2014 | Sysak .................. H01S 5/0265 372/45.012 |
| 2014/0198815 A1* | 7/2014 | Chung .................. H01S 5/021 372/38.02 |
| 2019/0067911 A1* | 2/2019 | Caer ..................... H01L 21/246 |

* cited by examiner

METHOD FOR MANUFACTURING A WAVEGUIDE FOR GUIDING AN ELECTRO-MAGNETIC WAVE

CROSS-REFERENCE TO RELATED APPLICATION

The present application is based on priority claimed on European Patent Application No. 18210105.5, filed on Dec. 4, 2018, the contents of which are incorporated herein by reference.

TECHNICAL FIELD

The present inventive concept relates to a method for manufacturing a waveguide for guiding an electro-magnetic wave.

BACKGROUND ART

Electro-magnetic waves, e.g. including waves of ultraviolet light, visible light or infrared light, may be useful as information carriers in many different applications. The electro-magnetic wave in a waveguide may be affected by an external influence so as to enable the affected electro-magnetic wave to carry information regarding the external influence, such as an external force. The electro-magnetic wave may also or alternatively be used for carrying information to a certain location, e.g. for actuating a response to the electro-magnetic wave at the location. In fact, the electro-magnetic wave may be part of a photonic integrated circuit for controlling functionality of the photonic integrated circuit in dependence of electro-magnetic wave(s).

Waveguides may be used for controlling propagation of electro-magnetic waves. Thus, a waveguide may be used for ensuring that an electro-magnetic wave is transferred from a first position to a second position. External influence on the waveguide may affect properties of the waveguide such that the electro-magnetic wave propagating in the waveguide is affected. This may be used for measuring and/or detecting external influence, by studying an electro-magnetic wave having propagated through the waveguide. Also, external influence may be used for controlling properties of the waveguide, such that a desired change in the electro-magnetic wave may be provided, e.g. for providing an actuation based on the electro-magnetic wave.

Optical waveguides for transmitting signals by light instead of by electrical signals may be advantageous in many applications. For instance, optical systems may, in relation to electrical wiring, be insensitive to capacitively coupled noise and electro-magnetic interference and may thus be used e.g. inside magnetic resonance imaging (MRI) scanners.

In order to provide accurate sensing and/or control based on electro-magnetic waves in the waveguide, properties of the waveguide should be sensitive. Thus, there may be a need of providing an improved waveguide for guiding an electro-magnetic wave.

Further, there is a need for enabling manufacturing of waveguides with an accurate control of properties of the waveguide in order to ensure that a high manufacturing yield may be provided.

SUMMARY

An objective of the present inventive concept is to provide a method for manufacturing a waveguide for guiding an electro-magnetic wave, which waveguide may be sensitive to external influence. Another objective of the present inventive concept is to provide a method for manufacturing of a waveguide which may enable a high manufacturing yield.

These and other objectives of the invention are at least partly met by the invention as defined in the independent claims. Preferred embodiments are set out in the dependent claims.

According to a first aspect, there is provided a method for manufacturing of a waveguide for guiding an electro-magnetic wave, said method comprising: forming a first waveguide layer, a sacrificial layer and a protection layer on a first wafer, the sacrificial layer being formed so as to provide a constant thickness of the sacrificial layer on the entire wafer; patterning the first waveguide layer, the sacrificial layer and the protection layer so as to define a pattern of a first waveguide part in the first waveguide layer, the sacrificial layer and the protection layer to form a lateral spacing between the pattern of the first waveguide part and a supporting structure in the first waveguide layer; selectively removing protection layer material from the waveguide pattern using a mask and then selectively etching the protection layer on the entire wafer to expose the sacrificial layer on the pattern of the first waveguide part while the protection layer still covers the sacrificial layer on the supporting structure; removing the sacrificial layer on the pattern of the first waveguide part; removing the protection layer; bonding a second wafer on the first wafer, the second wafer comprising a second waveguide part in a second waveguide layer, wherein the first and the second wafers are bonded by bonding the second wafer to the sacrificial layer of the first wafer such that the second waveguide part is supported by the supporting structure and a gap corresponding to the thickness of the sacrificial layer is formed between the first waveguide part and the second waveguide part and the first and second waveguide parts unitely form a single waveguide for guiding the electro-magnetic wave.

According to the inventive concept, a first and a second waveguide part may be configured to jointly guide an electro-magnetic wave. The waveguide may be very sensitive to a changed relation between the first and the second waveguide part. This may be due to an electro-magnetic field intensity of a waveguide mode being high at a position of the gap, at least in comparison to intensities of electro-magnetic field outside a waveguide material for other waveguides, such as a waveguide with a rectangular cross-section. Thus, the manufacturing method may result in a waveguide which is highly sensitive to external influence.

Thus, by changing a substance being present in the gap between the first and the second waveguide parts and/or by changing an electro-magnetic property of the substance present in the gap and/or by changing a size of the gap, the propagation properties of the waveguide may be changed and may be measured with high sensitivity.

It should also be realized that the waveguide need not necessarily be used in order to sense the gap being affected by an external influence. Rather, the waveguide may be manufactured to provide a static arrangement for guiding an electro-magnetic wave, wherein the waveguide may be accurately designed to have desired properties. Also, the waveguide may be used for providing an influence on an external device based on the electro-magnetic wave propagating in the waveguide. Thanks to the sensitivity of the waveguide, the influence provided by the electro-magnetic wave may be accurately controlled.

Thanks to the manufacturing method, the first waveguide layer may be used for defining the first waveguide part and also for defining supporting structures. Then, by ensuring that the sacrificial layer is only arranged on the supporting structures, a thickness of the sacrificial layer will define the size of the gap. Since a size of the gap is very important to the function of the waveguide, the method is beneficial in ensuring that variation in the size of the gap across the wafer and from different wafers is limited.

Also, the method is able to form a well-controlled gap between the first and the second waveguide parts, while allowing the second waveguide part to be arranged at a substantial distance from a surface on which the first waveguide layer is arranged. The lateral spacing between the pattern of the first waveguide part and the supporting structure may allow a structure formed from the second wafer and being arranged above the lateral spacing to be deformed, e.g. for detecting an external influence for causing the deformation.

The substantial distance of the second waveguide part from the surface on which the first waveguide layer is arranged may ensure that stiction is avoided such that deformation due to an external influence will not cause a permanent deformation of a structure arranged above the lateral spacing.

In the context of this application, "the first and second waveguide parts unitely form a single waveguide for guiding the electro-magnetic wave" implies that the first and second waveguide parts are configured to be so close to each other that an electro-magnetic wave propagating through the waveguide will be jointly propagated by the first and second waveguide parts. The electro-magnetic wave will be partly propagated by the first waveguide part and partly propagated by the second waveguide part. In other words, the waveguide parts are arranged to be so close to each other that an electro-magnetic wave cannot be coupled solely into the first waveguide part for being propagated solely therein. Similarly, an electro-magnetic wave cannot be coupled solely into the second waveguide part at a position along the first direction in the vicinity of a projection of the first waveguide part onto the second plane.

The gap should be construed as providing a distance between the first and the second waveguide parts. At least along a portion of the waveguide parts in the direction of propagation of the electro-magnetic wave, the gap may define a space, which may be filled by a gas or a liquid. However, in other portions of the waveguide parts in the direction of propagation of the electro-magnetic wave, the gap may be filled by a solid substance, such as the sacrificial layer.

In the context of this application, a structure being arranged "on" or "above" another structure should not be construed as the structures being arranged in a certain relationship with respect to an external reference (such as the earth). Rather, the term should be construed to define an internal relationship between the structures, which may for instance be related to an order in which the structures are formed on any surface of a substrate (top, bottom or side surfaces). A structure being arranged "on" or "above" another structure should further not be construed as necessarily being arranged directly on the other structure. Rather, one or more intermediate structures may be present.

The first waveguide part may be patterned to define a track which an electro-magnetic wave may follow in being guided by the waveguide. The first waveguide part may be patterned to follow a straight line so that the waveguide may guide an electro-magnetic wave along the straight line. However, the first waveguide part may alternatively be patterned to define bends in the track along which the electro-magnetic wave is guided. In some embodiments, the first waveguide part may be patterned to define a loop, even a closed loop.

According to an embodiment, the first waveguide part has a first width in a first direction perpendicular to a direction along which an electro-magnetic wave will be propagated in the waveguide and the second waveguide part has a second width in the first direction, wherein the second width is larger than the first width.

Propagation properties of the waveguide are mainly controlled by properties of the gap. Thanks to the second width being larger than the first width, a relation between the first and the second waveguide parts in the first direction may not significantly affect propagation properties of the waveguide. Rather, a displacement of the first waveguide part from a nominal position may not affect propagation properties of the waveguide, since a projection of the first width of the first waveguide part onto the second plane may still be arranged on a portion of the second waveguide part. Thus, the first and second waveguide parts may be arranged to oppose each other, separated by the gap, even if the first and/or second waveguide parts are displaced in the first direction. This implies that there is not a stringent requirement of aligning the first and second waveguide parts during manufacturing of the waveguide. Hence, the waveguide may be manufactured with relatively large tolerances in the first direction, which may simplify manufacture and/or increase yield in manufacturing of the waveguide.

The second waveguide part may also be patterned to follow the track in which the electro-magnetic wave is guided. However, according to an alternative, the second waveguide part is sufficiently wide in order for bends in the pattern of the first waveguide part still allowing the first and second waveguide parts to be arranged to oppose each other, separated by the gap.

In some embodiments, the first waveguide part may be patterned to define a loop, even a closed loop. The second waveguide part may be arranged in a plane to extend across the entire track defined by the first waveguide part, such that a projection of the track of the first waveguide part onto the plane of the second waveguide part fits within a rectangular portion of the second waveguide part. Thus, even for more complicated patterns of a track in which the electro-magnetic wave is to be guided, it may not be necessary to provide a correspondingly patterned second waveguide part. Hence, the second waveguide part may have a very simple shape, such as a rectangular shape, which facilitates manufacturing of the waveguide.

The materials and geometry of the first waveguide part, the second waveguide part, and the surroundings of the first and second waveguide parts may promote guiding of an electromagnetic wave along a track defined by the first waveguide part. For example, the first and the second waveguide parts may be composed of materials with a refractive index that is higher than the refractive index of the immediate surroundings.

According to an embodiment, the second width is at least two times larger than the first width.

This implies that a tolerance of placement of the first and second waveguide parts in the first direction during manufacturing of the waveguide may be high, while the first and second waveguide parts may still be arranged to oppose each other, separated by the gap.

It should however be realized that the second width may even be significantly larger than two times the first width, such that the second waveguide part may be viewed as a large sheet in relation to the first waveguide part.

According to an embodiment, the second waveguide layer forms a wide slab, which is configured to extend between supporting structures on opposite sides of the patterned first waveguide part when the first and second wafers are bonded.

Hence, it may be ensured that the second waveguide part extends over an entire track of the pattern of the first waveguide part. This may ensure that the manufacturing of the second waveguide layer is relatively simple. The second waveguide layer may be formed across the entire second wafer or may be formed in wide portions for defining a plurality of separate waveguides on the same wafer.

The waveguide may be designed in relation to a wavelength in the material of the first and second waveguide parts of the electro-magnetic wave to be guided by the waveguide. However, dimensions of the waveguide need not be limited for use with a single specific wavelength of the electro-magnetic wave. Rather, the waveguide may be used with a range of wavelengths, while providing desired propagation properties.

As used herein, the dimensions provide in relation to wavelengths of an electro-magnetic wave are related to a wavelength of the electro-magnetic wave in a bulk piece of the material, which is defined by the refractive index of the bulk piece of the material.

The waveguide may be designed to be used for guiding an electro-magnetic wave in a range of wavelengths within a spectrum corresponding to ultraviolet light, visible light and infrared light, such as in a range of 100 nm-10 µm. According to another embodiment, the waveguide may be designed to be used for guiding an electro-magnetic wave in a range of wavelengths within a spectrum corresponding to visible light and near-infrared light.

It should be realized that a particular waveguide may not be able to guide electro-magnetic waves over the entire range of wavelengths in the spectrum corresponding to ultraviolet light, visible light and infrared light. However, waveguides of the type described above may be used for guiding an electro-magnetic wave within a bandwidth of wavelengths that is within the range of wavelengths in the spectrum corresponding to ultraviolet light, visible light and infrared light.

According to an embodiment, the first width of the first waveguide part is smaller than 10 times a wavelength, preferably smaller than a wavelength, of the electro-magnetic wave to be guided by the waveguide.

The first width may be in an order of the wavelength of the electro-magnetic wave or even as small as a quarter of the wavelength. This may accurately define a propagation mode in the waveguide.

However, the first width may be allowed to be larger, such as the first width being smaller than 10 times the wavelength. A larger first width may imply that bends in the track to be followed by the electro-magnetic wave may need to be designed with a larger radius than in a waveguide having a first waveguide part with a smaller first width.

However, the first width may be even larger than 10 times the wavelength. This may also imply that a large bend radius may be required for bends of the waveguide in the pattern of at least the first waveguide part.

According to an embodiment, the gap, at least in an undeformed state of the waveguide, is smaller than half a wavelength, preferably smaller than a hundredth of a wavelength, of the electro-magnetic wave to be guided by the waveguide.

The size of the gap may be limited by capabilities of manufacturing of small dimensions. Thus, as manufacturing technology may allow smaller gaps to be used, the gap may be manufactured to be even smaller than a hundredth of a wavelength.

In an embodiment, the gap may be designed to be within a range of 10-100 nm.

However, in order to simplify manufacturing, the gap may be designed to be relatively large, e.g. to be smaller than half a wavelength. A larger gap may imply that a sensitivity of the propagation properties of the waveguide to properties of the gap may decrease.

According to an embodiment, the sacrificial layer is formed to have a thickness corresponding to half a wavelength, preferably smaller than a hundredth of a wavelength, of the electro-magnetic wave to be guided by the waveguide.

The thickness of the sacrificial layer will define the gap between the first and the second waveguide parts, so the thickness of the sacrificial layer may be controlled in forming of the sacrificial layer in relation to a desired size of the gap.

According to an embodiment, a combined thickness in a second direction, which is normal to the first and second wafers, of the first waveguide part and the second waveguide part is configured for providing a single mode waveguide in the second direction.

A single mode waveguide in the second direction may exhibit a field distribution of the electro-magnetic wave does not include zero crossings in the second direction in a cross-section of the waveguide. Since the cross-section includes the first and second waveguide parts with the gap therebetween, the field distribution may have local minima and maxima, but the field distribution still has no zero crossings.

This may be advantageous e.g. in that a clear optical signal may be provided, as there is no interference between different modes propagating in the waveguide.

According to an embodiment, the combined thickness in the second direction of the first waveguide part and the second waveguide part may be smaller than half a wavelength of the electro-magnetic wave to be guided by the waveguide. This may correspond to the first and second waveguide parts exhibiting a single mode waveguide in the second direction.

Thin waveguides may allow relatively small radii of bends in the track to be followed by the electro-magnetic wave. Even so, according to another embodiment, the combined thickness in the second direction of the first waveguide part and the second waveguide part may be smaller than a wavelength of the electro-magnetic wave to be guided by the waveguide. A thicker waveguide may allow multiple modes of electro-magnetic waves to be propagated in the waveguide, which may be desirable in certain applications.

According to an embodiment, a thickness of the first waveguide part in the second direction may be smaller than a wavelength. According to another embodiment, a thickness of the first waveguide part in the second direction may be smaller than half a wavelength. According to another embodiment, a thickness of the first waveguide part in the second direction may be smaller than a quarter of a wavelength. A smaller thickness of the first waveguide part may contribute to the first and second waveguide parts exhibiting a single mode waveguide in the second direction.

According to an embodiment, a thickness of the second waveguide part in the second direction may be smaller than a wavelength. According to another embodiment, a thickness of the second waveguide part in the second direction may be smaller than half a wavelength. According to another embodiment, a thickness of the second waveguide part in the second direction may be smaller than a quarter of a wavelength. A smaller thickness of the second waveguide part may contribute to the first and second waveguide parts exhibiting a single mode waveguide in the second direction.

According to an embodiment, the thicknesses of the first and the second waveguide parts in the second direction may be such that a significant fraction of electro-magnetic waves propagating in the waveguide is guided by the first waveguide part and a significant fraction of electro-magnetic waves propagating in the waveguide is guided by the second waveguide part.

Design of the first and second waveguide parts (with regard to e.g. geometry and material) may be based on desired properties of the waveguide, such as for achieving a desired sensitivity of the waveguide to effective refractive index changes or for achieving a desired track along which the electro-magnetic wave is to be guided. Based on such designs different relations between fractions being propagated in the first and the second waveguide parts may be provided and below some non-limiting examples are indicated.

Since the first and second waveguide parts are configured to unitely form a single waveguide, it may be difficult to determine fractions of the electro-magnetic waves being guided in the respective waveguide parts. However, at least through simulations, a relative power of the electro-magnetic wave in the respective waveguide part compared to a total power of the electro-magnetic wave in a mode may be determined.

For instance, at least 5% of the electro-magnetic wave propagating in the waveguide may be guided by the second waveguide part. In another embodiment, at least 10% or 20% of the electro-magnetic wave propagating in the waveguide may be guided by the second waveguide part.

In an embodiment, at least 60% of the electro-magnetic wave propagating in the waveguide may be guided by the first waveguide part. In another embodiment, at least 40% of the electro-magnetic wave propagating in the waveguide may be guided by the second waveguide part.

In an embodiment, 2-20% of the electro-magnetic wave propagating in the waveguide may be guided by the second waveguide part, and 30-80% propagating in the waveguide may be guided by the first waveguide part.

In another embodiment, more similar fractions are guided by the first and the second waveguide part, such as 10-50% of the electro-magnetic wave propagating in the waveguide may be guided by the first waveguide part and 10-50% of the electro-magnetic wave propagating in the waveguide may be guided by the second waveguide part.

According to an embodiment, the method further comprises after bonding the second wafer on the first wafer, selectively removing material of the second wafer to form a thin structure above the first waveguide part.

By forming a thin structure, a deformable structure, e.g. as a flexible membrane, may be formed above the first waveguide part. The thin structure may thus receive a force in order to be deformed for changing a size of the gap and dynamically changing propagation properties of the waveguide. Hence, with the forming of a thin structure, the method allows manufacturing of a waveguide, which may be used in a sensor for sensing an external influence or in a photonic integrated circuit, wherein the deformation of the thin structure may be controlled for controlling propagation of an electro-magnetic wave in the waveguide.

According to another embodiment, the method further comprises after bonding the second wafer on the first wafer, selectively removing material of the first wafer to form a thin structure above the second waveguide part.

Thus, instead of forming the thin structure above the first waveguide part, the thin structure may be formed above the second waveguide part.

The thin structure could for instance be flexible, such as forming a membrane, such that the thin structure may flex or vibrate based on an external force. For instance, this could be used for causing a membrane to vibrate based on an incident sound wave in order to enable detection of the sound wave. The thin structure may form a substantially planar structure. However, the thin structure need not have a homogeneous thickness, but may for instance instead be provided with an extra layer, e.g. on a center part of the thin structure, to design sensitivity of the thin structure to vibrations or pressure waves, such as a resonance wavelength of the thin structure. The sound wave may cause the thin structure with the second waveguide part to be moved in relation to the first waveguide part in order to vary the size of the gap based on the incident sound wave.

The thin structure may be arranged to extend between supporting structures or to be suspended from a supporting structure. Thus, the distance between the supporting structures may define an area of the thin structure on which an external force may be received. This area may define a sensing area in which the waveguide is arranged and/or may be used for defining a resonance wavelength of a membrane. However, it should be realized that the thin structure need not extend entirely between supporting structures. Rather, a structure being supported by the supporting structures may be patterned such that only a portion of the area between supporting structures is thin and configured to receive an external force, whereas above the supporting structures a relatively thick structure is provided.

According to an embodiment, the sacrificial layer is formed by thermal growth or by atomic layer deposition.

This implies that a very accurate control of a thickness and uniformity of the thickness of the sacrificial layer across the first wafer may be provided in order to ensure that an accurate control of the size of the gap may be provided.

According to an embodiment, the method further comprises, before said selectively removing protection layer material and after said patterning, depositing protection layer material on the first wafer.

This implies that a thickness of the protection layer on the supporting structure is increased. Thus, a relatively large thickness of the protection layer may be provided before protection layer material is selectively removed from the waveguide pattern. This ensures that a large difference in thickness of the protection layer arranged above the waveguide pattern and above the supporting structure may be provided, by removing a large thickness of the protection layer in the selective removing of the protection layer material from the waveguide pattern using a mask, before the protection layer is selectively etched to expose the sacrificial layer on the pattern of the first waveguide part. Hence, it may be ensured that the sacrificial layer is removed from the pattern of the first waveguide part while not removing any sacrificial layer from the supporting structure.

By increasing a thickness of the protection layer after patterning of the first waveguide layer, the sacrificial layer and the protection layer, it may be ensured that the patterning need not be performed in a very thick protection layer. This may facilitate forming of small structures in the first waveguide layer.

According to an embodiment, said selectively removing of protection layer material comprises defining the mask by optical lithography, selectively etching the protection layer in the area defined by the mask using a dry etch, and removing the mask.

This may facilitate defining of a selected area in which the protection layer is etched.

According to an embodiment, said selectively etching the protection layer comprises etching using a wet etch selective to the protection layer material.

This may ensure that the protection layer may be completely removed from the pattern of the first waveguide part. Since the method ensures that a difference in thickness of the protection layer on the first waveguide part and on the supporting structure is provided, the etching of the protection layer may be performed without exposing the sacrificial layer on the supporting structure.

According to an embodiment, said removing of the sacrificial layer comprises etching using a wet etch selective to sacrificial layer material.

Thus, the sacrificial layer may be selectively etched on the first waveguide part without need of a mask. The protection layer arranged on the sacrificial layer on the supporting structure ensures that the sacrificial layer is not etched on the supporting structure.

According to an embodiment, said removing of the protection layer comprises etching using a wet etch selective to the protection layer material.

Once the sacrificial layer has been removed on the pattern of the first waveguide part, the protection layer material may only be remaining on the supporting structures and needs to be removed in order to provide an accurate height of the supporting structure in relation to a height of the waveguide part (i.e. the thickness of the sacrificial layer). The protection layer may thus be removed without need of a mask by using a wet etch selective to the protection layer material.

According to an embodiment, said patterning of the first waveguide layer, the sacrificial layer and the protection layer further defines a third waveguide part in the first waveguide layer, wherein the first and the second wafers are bonded by bonding the second wafer to the sacrificial layer of the first wafer such that the second waveguide part is supported by the supporting structure and a gap corresponding to the thickness of the sacrificial layer is formed between the third waveguide part and the second waveguide part and the second and third waveguide parts unitely form a single waveguide for guiding an electro-magnetic wave in a closed loop in a plane parallel to the first wafer.

The closed loop defined by the waveguide of the third and second waveguide parts may be used as an electro-magnetic resonator. A resonance wavelength of the electro-magnetic resonator may be changed based on a change in a property of the gap changing the effective refractive index of the electro-magnetic resonator. This may be used for providing a strong response to a change in the property of the gap, so that a sensor using the manufactured waveguide may provide a high sensitivity.

The electro-magnetic wave may be transferred in a waveguide formed by the first and second waveguide parts, which is arranged in the vicinity of the electro-magnetic resonator. The electro-magnetic wave may thus have a fraction, e.g. due to an evanescent field, that is coupled into the electro-magnetic resonator defined by the third and second waveguide parts. If the wavelength of the electro-magnetic wave corresponds to the resonance wavelength of the electro-magnetic resonator, the electro-magnetic wave will be strongly coupled into the electro-magnetic resonator and a dip in intensity of the electro-magnetic wave being transferred in the waveguide in the vicinity of the electro-magnetic resonator may be observed.

According to an embodiment, the first and second waveguide layers are formed by silicon or silicon nitride, and the sacrificial layer is formed by silicon dioxide.

Silicon may suitably be used for manufacturing a waveguide to guide electro-magnetic waves in an infrared range, as silicon is transparent to wavelengths in the infrared range.

Silicon nitride may suitably be used for manufacturing a waveguide to guide electro-magnetic waves in range of visible light, as silicon nitride is transparent to visible light.

The use of silicon or silicon nitride and silicon dioxide in manufacturing of the waveguide is further suitable as these materials are well known and commonly used in semiconductor processing.

It should be realized that other materials may be used instead. For instance, any of the materials in the group comprising: a titanium oxide germanium, indium-gallium-arsenide, gallium-arsenide, indium-phosphide, aluminum-gallium-arsenide, and lithium-niobate may be used in the first and second waveguide layers.

The sacrificial layer may be formed from another material, which allows for bonding of the first and second wafers through the material of the sacrificial layer. Also, the material of the sacrificial layer is preferably highly etch selective towards the material of the first waveguide layer, such that the sacrificial layer may be removed on the pattern of the first waveguide part without affecting the first waveguide part.

It should also be realized that the first and the second waveguide parts need not necessarily be formed from the same material. According to an embodiment, one of the first and the second waveguide parts may be formed from silicon and the other may be formed from silicon nitride.

According to an embodiment, the second wafer comprises a top bonding layer, wherein the first and the second wafers are bonded by bonding of the bonding layer of the second wafer to the sacrificial layer of the first wafer.

The top bonding layer of the second wafer may form a thin protection layer to the second wafer and may also be adapted for forming a strong bonding of the first and second wafers.

For instance, the top bonding layer may be formed from the same material as the sacrificial layer, such that a bonding may be formed between the same material in the top bonding layer and the sacrificial layer. The top bonding layer and the sacrificial layer may for instance be silicon dioxide.

The top bonding layer may provide a homogeneous thickness on the entire second wafer, such that the gap formed between the second waveguide part with a thin top bonding layer facing the first waveguide part and the first waveguide part still corresponds to the thickness of the sacrificial layer.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
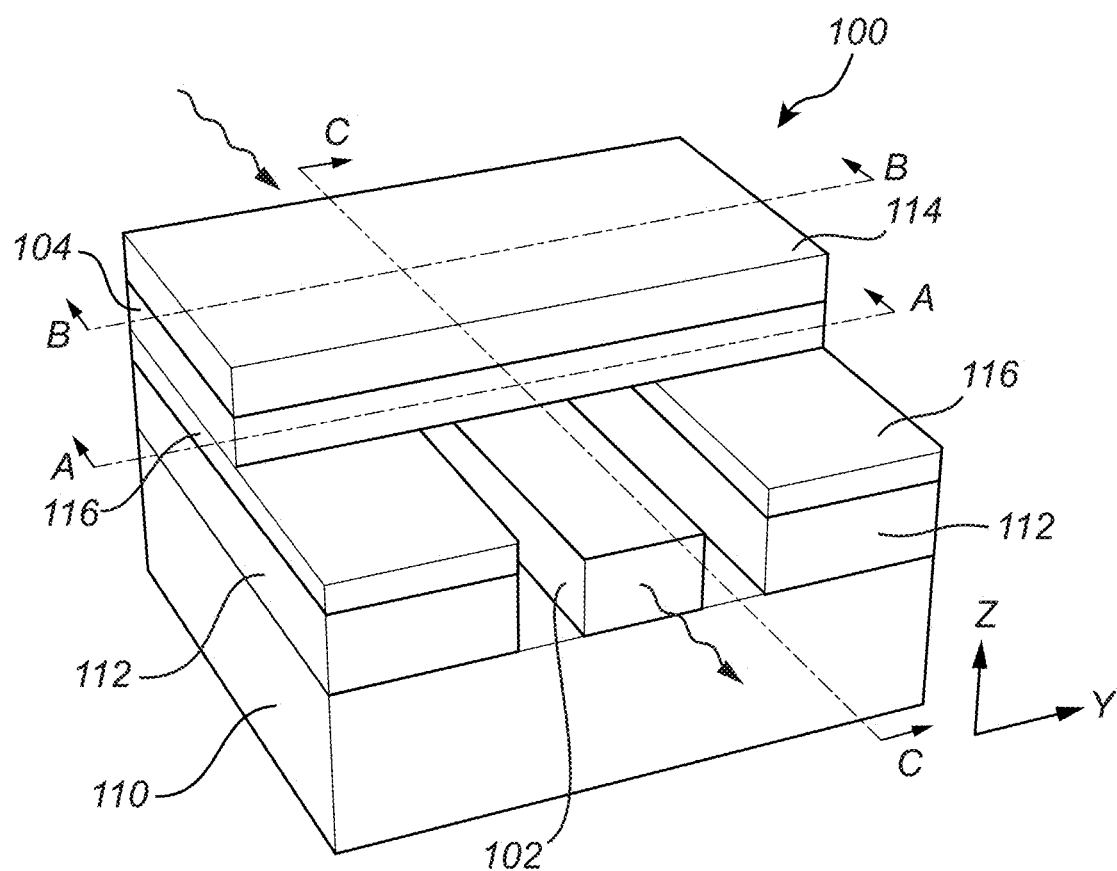
FIG. 1 is a perspective view of a waveguide according to an embodiment.
Figure 2:
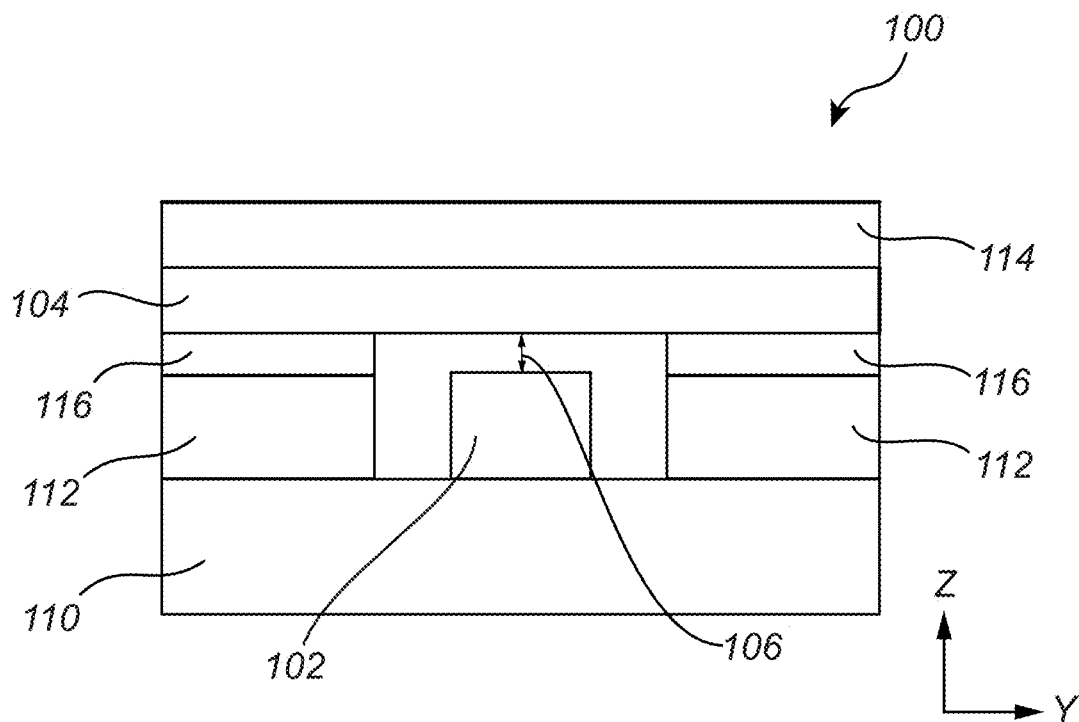
FIG. 2 is a cross-sectional view of the waveguide of FIG. 1 taken along lines A-A.

Referring now to FIGS. 1-2, a waveguide 100 for guiding an electro-magnetic wave will be described.

The waveguide 100 will firstly be described in relation to using the waveguide 100 in a sensor for detecting an external force, but it should be realized that the waveguide 100 may be used in other applications as well, as will be further described at the end of the description. Hence, any discussion of the waveguide 100 in relation to detecting an external force should not be construed as limiting to the generic waveguide of the inventive concept.

The waveguide 100 is schematically illustrated in FIG. 1 in a perspective view, wherein top layers have been partly removed in order to better show underlying layers. FIG. 2 shows a cross-section of the waveguide 100 taken along lines A-A in FIG. 1.

The waveguide 100 comprises a first waveguide part 102 and a second waveguide part 104. The waveguide 100 may be formed on a substrate 110 with the first and the second waveguide parts 102, 104 being arranged in different layers on the substrate 110, so as to extend in a first plane and a second plane, respectively.

The waveguide 100 is illustrated in FIG. 1 with the first waveguide part 102 being arranged on the substrate 110 and the second waveguide part 104 being arranged above the first waveguide part 102. It should be realized that the waveguide parts 102, 104 may instead be arranged in an inverted relationship, with the second waveguide part 104 being arranged on the substrate 110 and the first waveguide part 102 being arranged above the second waveguide part 104.

The first waveguide part 102 may be patterned in the first plane so as to define a track along which an electro-magnetic wave will be propagated in the waveguide 100. The first waveguide part 102 may be arranged in a trench or cavity formed on the substrate 110 such that the first waveguide part 102 is spaced in a lateral direction in the first plane from walls defining the trench or cavity. These walls may be formed from the same material as the first waveguide part 102, which may simplify manufacture of the waveguide 100, but the walls will not contribute to guiding of an electro-magnetic wave. The walls may function as a support for the second waveguide part 104 or a structure on which the second waveguide part 104 is formed and will therefore in the following be referred to as supporting structures 112.

The first waveguide part 102 has a first width in the first plane in a first direction Y perpendicular to the direction of propagation of the electro-magnetic wave in the waveguide 100. The width of the first waveguide part 102 may confine the electro-magnetic wave in a direction perpendicular to the direction of propagation of the electro-magnetic wave in order for the electro-magnetic wave to be guided along the track defined by the first waveguide part 102.

The first waveguide part 102 and the second waveguide part 104 may be spaced apart by a gap 106 extending in a second direction Z perpendicular to the first and the second planes. The gap 106 may have a size which is sufficiently small such that the first and second waveguide parts 102, 104 unitely form a single waveguide 100 for guiding the electro-magnetic wave. This implies that the first and second waveguide parts 102, 104 are configured to be so close to each other that an electro-magnetic wave propagating through the waveguide will be jointly propagated by the first and second waveguide parts. The electro-magnetic wave will be partly propagated by the first waveguide part 102 and partly propagated by the second waveguide part 104. In other words, the waveguide parts are arranged to be so close to each other that an electro-magnetic wave cannot be coupled solely into the first waveguide part 102 for being propagated solely therein. Similarly, an electro-magnetic wave cannot be coupled solely into the second waveguide part 104 at a position along the first direction in the vicinity of a projection of the first waveguide part 102 onto the second plane so that the electro-magnetic wave would be propagated solely in the second waveguide part 104.

Figure 3:
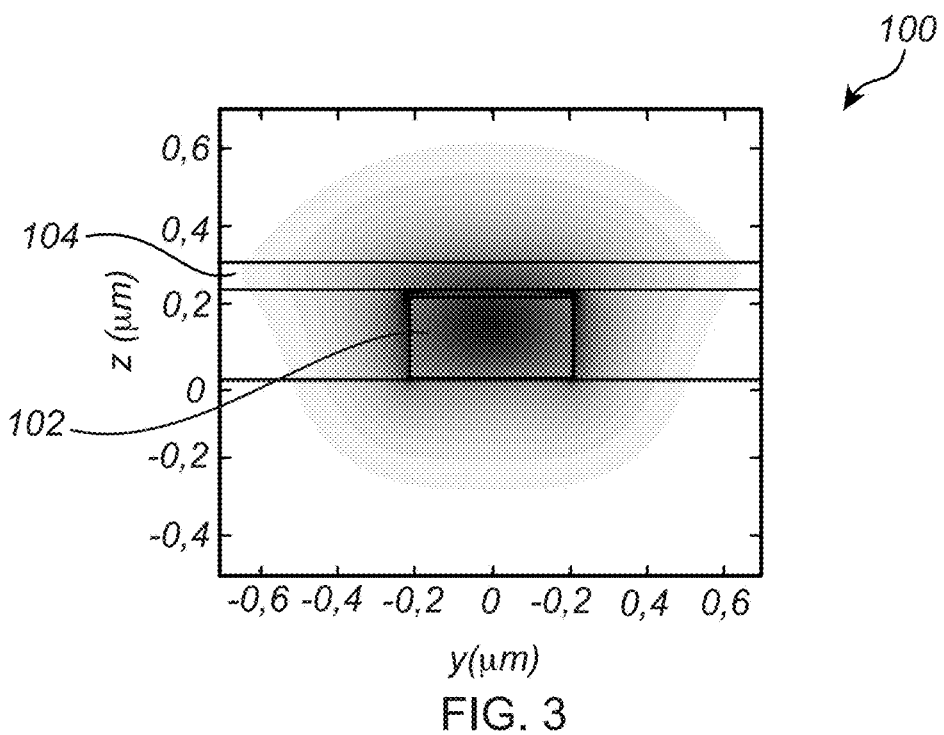
FIG. 3 is a schematic cross-section of a waveguide according to an embodiment illustrating a distribution of an electro-magnetic field in the waveguide.

Propagation properties of the waveguide 100 may be largely affected by properties of the gap 106. This may be due to an electro-magnetic field intensity of a waveguide mode being high at a position of the gap 106. This is schematically illustrated in FIG. 3, which shows a simulation of a distribution of an electric field of a waveguide mode in a cross-section of the waveguide 100.

Hence, if a property of the gap 106 is changed, this will cause a change in the propagation speed of an electro-magnetic wave in the waveguide 100 so as to change an effective refractive index of the waveguide 100. Thus, if the size of the gap 106 is changed, a large influence on propagation of the electro-magnetic wave in the waveguide 100 is provided. This may be used for sensing of an external influence causing a change in the size of the gap 106 as will be described in further detail below.

Referring again to FIGS. 1-2, the second waveguide part 104 or a structure on which the second waveguide part 104 is formed may be supported by the supporting structures 112. The supporting structures 112 may define a height in the second direction Z which is larger than a height (thickness) of the first waveguide part. Thus, by the second waveguide part 104 being supported by the supporting structures 112, the second waveguide part 104 will be arranged spaced apart from the first waveguide part 102 by the gap 106.

The second waveguide part 104 has a second width in the first direction Y, which is larger than the first width. The second waveguide part 104 may be configured to have a large extension in the second plane. In an embodiment, the second waveguide part 104 may be formed as a slab waveguide part, i.e. in relation to a thickness of the second waveguide part 104, propagation of the electro-magnetic wave in the second waveguide part 104 may be modeled by the second waveguide part 104 having an infinite extension in the second plane.

The second waveguide part 104 may be configured as a large rectangular sheet, which may cover the first waveguide part 102. Hence, the second waveguide part 104 may not need to be patterned to follow the track defined by the first waveguide part 102. Rather, a projection of the track of the first waveguide part onto the second plane may fit within the rectangular sheet forming the second waveguide part 104.

This may imply that the waveguide 100 defined unitely by the first and the second waveguide part 102, 104 may guide an electro-magnetic wave along the track which is only patterned in the first waveguide part 102. Hence, the first waveguide part 102 may control the track along which the electro-magnetic wave is propagated. Still, the first and the second waveguide parts 102, 104 will jointly guide the electro-magnetic wave, as a fraction of the wave will be propagated in each of the first and the second waveguide parts 102, 104.

According to an embodiment, the second waveguide part 104 has a second width which is slightly larger than the first width. Thus, the second waveguide part 104 may not be vastly wider than the first waveguide part 102. The second waveguide part 104 being wider than the first waveguide part 102 still ensures that a relation between the first and the second waveguide parts 102, 104 in the first direction Y may not significantly affect propagation properties of the waveguide 100. Rather, a displacement of the first waveguide part 102 from a nominal position may not affect propagation properties of the waveguide 100, since a projection of the first width of the first waveguide part 102 onto the second plane may still be arranged on a portion of the second waveguide part 104. This implies that there is not a stringent requirement of aligning the first and second waveguide parts 102, 104 during manufacturing of the waveguide 100. Hence, the waveguide 100 may be manufactured with relatively large tolerances in the first direction Y, which may simplify manufacture and/or increase yield in manufacturing of the waveguide 100.

In an embodiment, the second width may be at least two times the first width. This may ensure that very large tolerances in the placement of the first waveguide part 102 in the first direction Y may be used in manufacturing. However, the second waveguide part 104 may need to be at least partly patterned to follow the track defined by the first waveguide part 102 and may not be simply formed as a rectangular sheet.

The gap 106 as well as the lateral spacing between the first waveguide part 102 and the supporting structures 112 may be filled by a gaseous medium, such as air, or a liquid medium, which may be arranged in a confined space of the waveguide 100. The first waveguide part 102 may thus be surrounded by a medium, which is suitable for promoting propagation of an electro-magnetic wave in the waveguide 100.

As an alternative, the first waveguide part 102 may be surrounded by a cladding material on lateral sides of the first waveguide part 102 in the first plane. Thus, the lateral spacing between the first waveguide part 102 and the supporting structures 112 may be filled by the cladding material, or the first waveguide part 102 may be formed in a trench within the cladding material.

A layer of cladding material on the substrate 110 may be arranged below the first waveguide part 102 in order to promote propagation of the electro-magnetic wave in the waveguide 100. Alternatively, an insulator layer of the substrate 110 may function as a cladding material, e.g. if the substrate 110 is a silicon-on-insulator substrate 110 on which the waveguide 100 is formed. In the figures, only an insulator layer of the substrate 110 is illustrated.

The waveguide 100 may further comprise a layer 114 of cladding material above the second waveguide part 104 in order to promote propagation of the electro-magnetic wave in the waveguide 100.

The layer 114 of cladding material may also function to isolate the waveguide 100 from an influence of a medium above the waveguide 100. This may be important e.g. if the waveguide is to be used for sensing in a liquid, such as for ultrasound sensing in water.

An interface of the second waveguide part 104 facing the substrate 110 may be surrounded by the medium filling the gap 106 and the lateral spacing between the first waveguide part 102 and the supporting structures 112.

Further, a top layer 116 of the supporting structures 112 may be formed by a cladding material. This may be suitable as the gap 106 may in portions of the waveguide 100 be filled by the same material as in the top layer 116, which may then be a suitable material to be used within the gap 106 of the waveguide 100.

In the following, some dimensions of the waveguide 100 will be discussed in relation to a wavelength in a bulk piece of the material of the first and second waveguide parts of the electro-magnetic wave to be guided by the waveguide.

The waveguide may be designed to be used for guiding an electro-magnetic wave in a range of wavelengths within a spectrum corresponding to ultraviolet light, visible light and infrared light, such as in a range of 100 nm-10 µm. According to another embodiment, the waveguide may be designed to be used for guiding an electro-magnetic wave in a range of wavelengths within a spectrum corresponding to visible light and near-infrared light.

The waveguide 100 may be dimensioned in order to restrict a number of modes propagating in the waveguide 100. In an embodiment, the waveguide 100 may be dimensioned to form a single-mode waveguide at least with respect to one direction. This may ensure an accurate control of the electro-magnetic wave in the waveguide 100.

However, the waveguide 100 may alternatively be formed with larger dimensions. This may imply that the waveguide 100 exhibits a lower contrast of changes in effective refractive index to the changing of a property of the gap 106. Also, the waveguide 100 may need to be formed with larger bend radius when changing directions of propagation of the electro-magnetic wave 102 in the waveguide 100.

According to an embodiment, the first width of the first waveguide part 102 is smaller than 10 times a wavelength, preferably smaller than a wavelength, of the electro-magnetic wave to be guided by the waveguide 100. According to an embodiment, the first width of the first waveguide part 102 is in a range of a quarter of a wavelength to 10 times a wavelength of the electro-magnetic wave.

According to an embodiment, the gap 106, at least in an undeformed state of the waveguide 100, is smaller than half a wavelength, preferably smaller than a hundredth of a wavelength, of the electro-magnetic wave to be guided by the waveguide 100.

In an embodiment, the gap 106 may be designed to be within a range of 10-100 nm.

According to an embodiment, the combined thickness in the second direction Y of the first waveguide part 102 and the second waveguide part 104 may be smaller than a wavelength, preferably smaller than half a wavelength, of the electro-magnetic wave to be guided by the waveguide 100. With the thickness of the first and the second waveguide parts 102, 104 being smaller than half a wavelength, the first and second waveguide parts 102, 104 may exhibit a single mode waveguide in the second direction Y.

Figure 4:
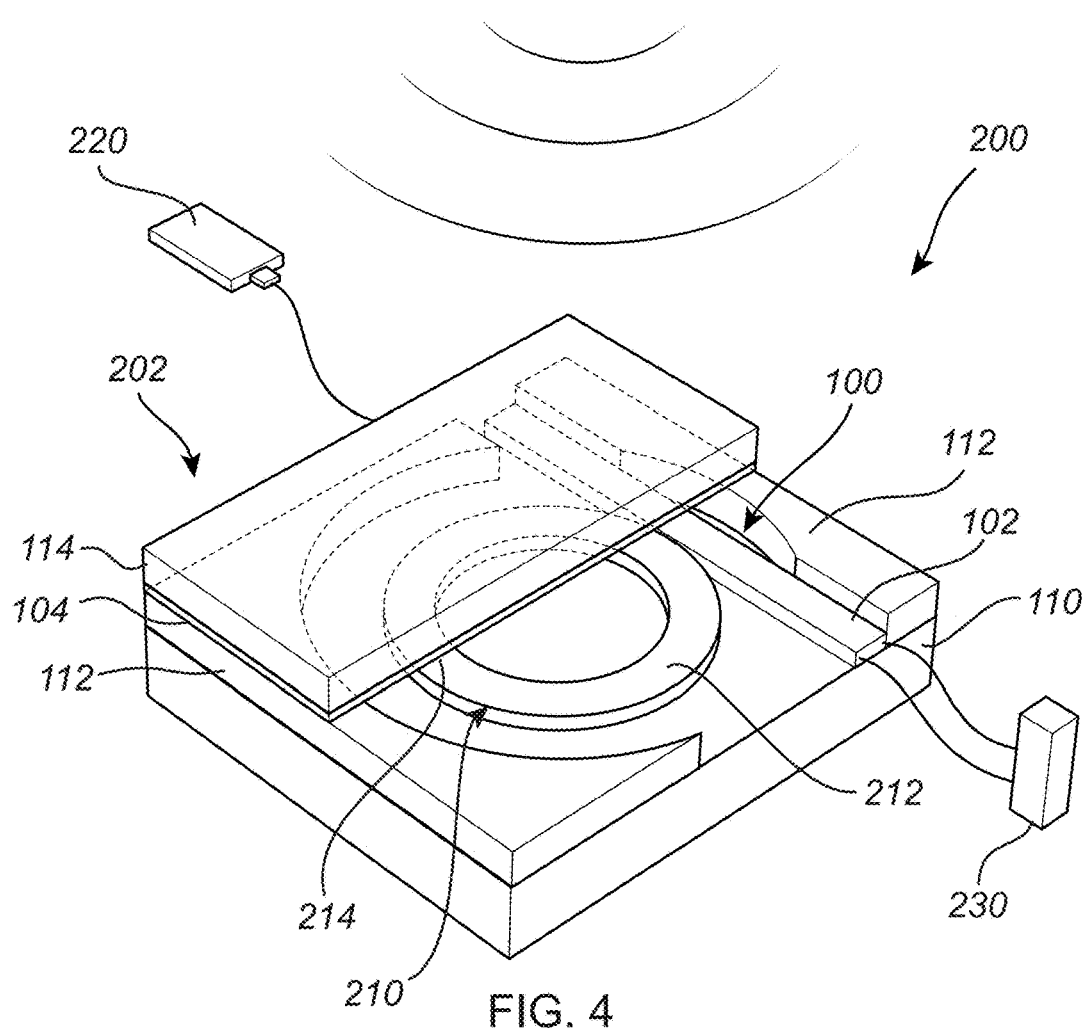
FIG. 4 is a schematic view of a sensor according to an embodiment.

As mentioned above, the first waveguide part 102 may be formed in a trench between supporting structures 112. This may be useful for guiding the electro-magnetic wave in the waveguide 100. However, when using the waveguide 100 in a sensor 200, as illustrated in FIG. 4, the waveguide 100 may be associated with a cavity, which may be dimensioned with respect to facilitating detection of an external influence. The waveguide 100 is schematically illustrated in FIG. 4 in a perspective view, wherein top layers have been partly removed in order to better show underlying layers. It should be realized that the second waveguide part 104 and the layer of cladding material 114 may extend over the entire cavity.

The cavity may provide a space in which an effect of the external influence may take place so as to enable detection of the external influence. Here, a relatively large distance (compared to the illustration in FIG. 1) is provided between the supporting structures 112. A thin structure 202 may be supported by the supporting structures 112 and may be configured for receiving an external force.

The cavity may be defined by the substrate 110 or a layer on the substrate 110 forming a bottom of the cavity, the supporting structures 112 forming side walls of the cavity and the thin structure 202 forming a top of the cavity. The cavity need not necessarily be completely enclosed. For instance, the side walls need not completely enclose the cavity. At least openings in the side walls may be provided, e.g. for allowing a flow of a medium filling the cavity to be transported in and out of the cavity, and allowing a portion of the waveguide 100 to transport the electro-magnetic wave to and from a portion of the waveguide 100 formed in the cavity (or allowing a separate waveguide to transport the electro-magnetic wave to and from the waveguide 100 formed in the cavity). Further, as discussed in further detail below, the thin structure 202 need not necessarily extend entirely between the side walls (supporting structures 112).

The thin structure 202 may be flexible so as to allow deforming a shape of the thin structure 202. The thin structure 202 may be formed by a flexible material, but the structure 202 may also be flexible merely by the structure 202 being very thin.

The thin structure 202 may be viewed as a membrane 202, which is arranged to be supported by the supporting structures 112 and be deformable therebetween. In the following, the thin structure 202 will be mainly referred to as a membrane 202, although it should not be construed as necessarily being a membrane 202.

The thin structure 202 may form a substantially planar structure. However, the thin structure 202 need not have a homogeneous thickness, but may for instance instead be provided with an extra layer or pattern, e.g. on a center part of the thin structure 202, to design sensitivity of the thin structure 202 to vibrations or pressure waves, such as a resonance wavelength of the thin structure 202.

The second waveguide part 104 may form part of the membrane 202. According to an embodiment, the second waveguide part 104 may be formed as a layer extending over the entire membrane 202. The layer 114 of cladding material above the second waveguide part 104 may also form part of the membrane 202. In fact, in an embodiment, the second waveguide part 104 and the layer 114 of cladding material may constitute the membrane 202.

The second waveguide part 104 and the layer 114 of cladding material may thus be designed to provide desirable properties of the membrane 202.

However, according to an alternative, the second waveguide part 104 may be formed on a portion of the membrane 202.

According to yet a further alternative, the second waveguide part 104 may be formed on the substrate 110. The first waveguide part 102 may thus be formed on the membrane 202. In fact, as described below, the first and the second waveguide part 102, 104 may be formed on separate substrates which are bonded together forming the gap 106 between the first and the second waveguide part 102, 104. Then, the bonded structure may be thinned and/or patterned from either side to form the membrane 202 and hence placing either the first waveguide part 102 or the second waveguide part 104 on the membrane 202.

In case the first waveguide part 104 is arranged on the membrane 202, the membrane 202 may thus be supported by the supporting structures 112 (which are formed on a common substrate with the first waveguide part 102 before bonding of substrates) and the first waveguide part 102 may be patterned on a side of the membrane 202 facing the substrate 110 such that the first waveguide part 102 may extend towards the second waveguide part 104 and be spaced apart from the second waveguide part 104 by the gap 106.

The membrane 202 may be configured to be deformed upon receiving an external force, here illustrated as an incident sound wave. The deformation of the membrane 202 will cause a change in the size of the gap 106 between the first and the second waveguide parts 102, 104, which will thus affect the propagation properties of the waveguide 100. Hence, the deformation may be measured based on the propagation of electro-magnetic waves in the waveguide 100 so as to allow a measure of the external force to be acquired. For instance, if the external force is in the form of an incident sound wave, the sensor 200 may be used as a sound sensor.

The membrane 202 may be configured to have a resonant frequency in a frequency range of interest of an incident sound wave (or other force). In particular when the sensor 200 is used for ultrasound sensing, a membrane having a resonant frequency in the ultrasound range may be used. The membrane 202 may thus provide a large deformation so as to facilitate sensing of the (ultrasonic) sound wave.

According to an embodiment, the sensor 200 may be used as a sound sensor, which is configured to detect audible sound.

According to another embodiment, the sensor 200 may be used as an ultrasound sensor, which is configured to detect acoustic waves in the ultrasound frequency range.

According to another embodiment, the sensor 200 may be used as a pressure sensor, which is configured to detect a pressure wave.

According to another embodiment, the sensor 200 may be used for sensing a force, which may not necessarily be provided as a wave. For instance, the sensor 200 may be used for detecting a static pressure, e.g. a gaseous pressure which may cause a deformation of the membrane 202. For instance, such a sensor may be used for detecting a temperature (affecting the gaseous pressure).

According to another embodiment, the sensor 200 may be used for detecting a mass arranged on a surface of the membrane 202. The surface of the membrane 202 may for instance be prepared with a substance, providing a functionalized surface in that a particle or substance of interest may be selectively bonded to the substance on the functionalized membrane surface so as to change a mass bonded to the surface and hence cause a change in mechanical resonance frequency of the membrane 202, or cause a deformation of the membrane 202.

The membrane 202 may be designed to be adapted for a desired functionality of the sensor 200. Hence, a thickness and size of the membrane 202 may be designed based on desired functionality.

In one embodiment, e.g. for ultrasound detection, the membrane 202 may have a thickness of approximately 2 µm, which may be mainly formed of the layer 114 of cladding material (a thickness of the second waveguide part 104 may be negligible in relation to a thickness of the layer 114). The membrane may further have a diameter in a range of 20-200 µm.

However, it should be realized that very different sizes of membranes may be used depending on a desired functionality of the sensor.

A height of the cavity, as defined by a height of the supporting structures 112, between the bottom of the cavity and the membrane 202 may be adapted to enable deformation of the membrane 202 without causing stiction of the membrane 202 to the bottom of the cavity.

Hence, the height of the cavity may be configured to be larger than a maximum displacement of the thin structure 202 due to an external force which may be applied to the thin structure 202 and which may or may not be the force that is sensed by the sensor 200. The size of the height of the cavity and other dimensions of the cavity may also or alternatively be defined to fit a frequency of an incident sound wave such that the sensor may be specifically adapted for sound detection.

Referring now to FIGS. 5a-f, different embodiments of providing support for the second waveguide part 104 above the first waveguide part 102 will be described. In FIGS. 5a-f, the electro-magnetic resonator 210 as further described below is not illustrated in the cavity, but it should be realized that at least in some of the embodiments illustrated, the electro-magnetic resonator 210 may also be arranged in the cavity.

Figure 5A:
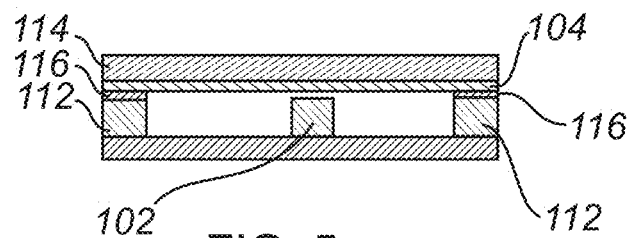
FIG. 5a is a cross-sectional view of a sensing area of the sensor according to a first embodiment.

As illustrated in FIG. 5a, a membrane 202 may be arranged to be supported on supporting structures 112 at opposite sides of the cavity for arranging the membrane 202 above the cavity.

Figure 5B:
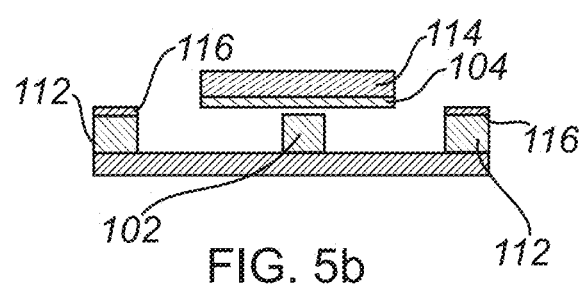
FIG. 5b is a cross-sectional view of a sensing area of the sensor according to a second embodiment.

In an alternative embodiment illustrated in FIG. 5b, the second waveguide part 104 may not be supported by the supporting structures 112 at opposite sides of the cavity. Rather, the second waveguide part 104 may be arranged on a beam-type structure, which may be supported at an end of the second waveguide part 104 in a direction of propagation of the electro-magnetic wave (i.e. not shown in the cross-section of FIG. 5b), or at least be supported at a position along the direction of propagation of the electro-magnetic wave before the cavity is reached. The beam-type structure may be supported at opposite sides of the cavity in the direction of propagation of the electro-magnetic wave.

Figure 5C:
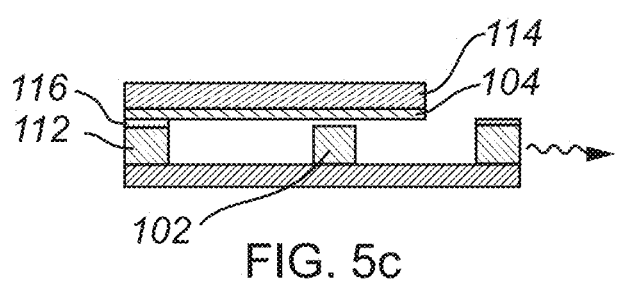
FIG. 5c is a cross-sectional view of a sensing area of the sensor according to a third embodiment.

As illustrated in FIG. 5c, the second waveguide part 104 may be supported only at one supporting structure 112 forming a cantilevered structure extending from the supporting structure 112 to be arranged above the first waveguide part 102.

Figure 5D:
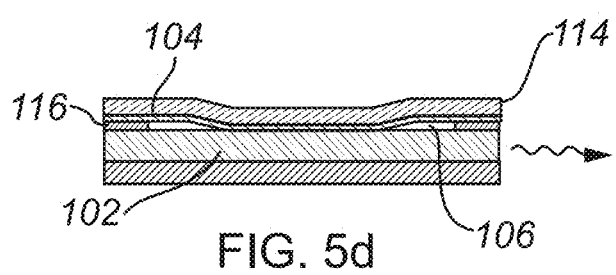
FIG. 5d is a length-wise cross-section of a waveguide according to an embodiment.

As illustrated in FIG. 5d, showing a lengthwise cross-section of the waveguide 100, i.e. light being propagated from left to right in the waveguide 100 shown in FIG. 5d, the second waveguide part 104 may be arranged to rest on the first waveguide part 102 at least along a portion of the waveguide 100 in the direction of propagation of the electro-magnetic wave through the waveguide 100.

In an undeformed state of the waveguide 100, the second waveguide part 104 may be arranged above the first waveguide part 102 such that the second waveguide part 104 does not rest or partially rests on the first waveguide part 102. As an increasingly higher force is applied to the membrane 202, an increasingly larger portion of the second waveguide part 104 may be pushed to rest on the first waveguide part 102, so that a size of an area in which the second waveguide part 104 rests on the first waveguide part 102 is changed for changing propagation properties of the waveguide 100.

Figure 5E:
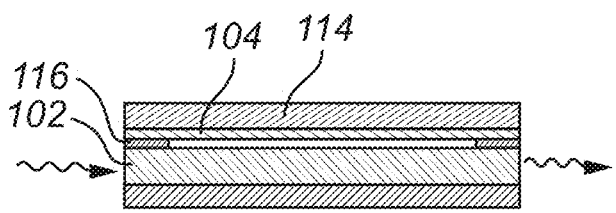
FIG. 5e is a length-wise cross-section of the waveguide of FIG. 1 taken along lines C-C.
Figure 5F:
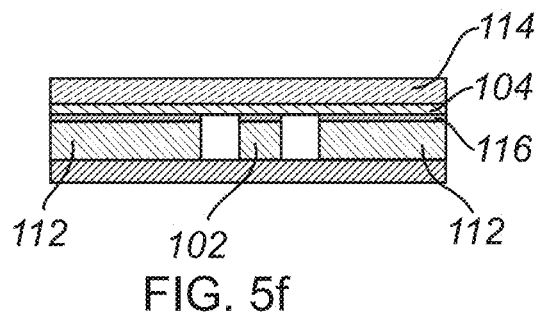
FIG. 5f is a cross-sectional view of the waveguide of FIG. 1 taken along lines B-B.

It should also be realized that, in some embodiments, the gap 106 need not necessarily be formed along the entire direction of propagation of the electro-magnetic wave. Rather, the gap 106 may be present only in portions of the waveguide 100 corresponding to a sensing area, i.e. wherein the size of the gap 106 is to be changed. Thus, as illustrated in FIG. 5e, showing a lengthwise cross-section of the waveguide along lines C-C in FIG. 1, the gap 106 may be filled by the layer 116 of cladding material between the first and the second waveguide parts 102, 104 in portions of the waveguide 100 on opposite sides of a sensing area. This is also illustrated in FIG. 5f, showing a cross-section of the waveguide 100 at a portion of the waveguide 100 before the sensing area, along lines B-B in FIG. 1. Hence, the waveguide 100 may have a gap 106 with a dynamically changeable property only in portions of the waveguide 100 corresponding to a sensing area.

The cavity (with any arrangement of the second waveguide part 104 as discussed in relation to FIGS. 5a-f above) may hence define a sensing area, in which the sensor 200 is arranged to receive an external force for sensing the force. As mentioned above, the deformation of the membrane 202 will cause a size of the gap 106 to be changed from a size of the gap 106 in an undeformed state of the membrane 202.

The change in the size of the gap 106 between the first and the second waveguide parts 102, 104, will affect the propagation properties of the waveguide 100. This may be measured by measuring the electro-magnetic wave propagating in the waveguide 100.

In particular, the change in the size of the gap 106 may cause an effective refractive index of the waveguide 100 to be changed. This implies that a speed of the electro-magnetic wave propagating through the waveguide 100 may change, which may be observed as a phase shift of the electro-magnetic wave compared to an electro-magnetic wave propagating through the waveguide 100 in an undeformed state of the membrane 202.

The phase shift may be measured in many different ways as may be realized by a person skilled in the art. A size of the phase shift will also be dependent on how much the size of the gap 106 has changed such that the measure of the phase shift may be correlated to a measure of the deformation of the membrane 202, which may further be converted to a measure of the external force.

For instance, the phase shift may be measured by relating the electro-magnetic wave having propagated through the waveguide 100 to a stable reference.

In a simplest form, the first waveguide part 102 may be formed along a straight line extending under the membrane 202. The sensor 200 may further be configured to couple the electro-magnetic wave into the waveguide 100 at a first position on one side of the membrane 202 and couple the electro-magnetic wave out of the waveguide at a second position on an opposite side of the membrane 202 for detecting the electro-magnetic wave in relation to the reference and determining the phase shift.

According to an embodiment, the sensor 200 may comprise an electro-magnetic resonator 210 in the sensing area of the sensor 200. The electro-magnetic resonator 210 may be designed to provide a resonating effect in an optical path. The electro-magnetic resonator 210 may be formed based on the waveguide 100 having the first waveguide part 102 and the second waveguide part 104 separated by the gap 106.

In an embodiment, the electro-magnetic resonator 210 may comprise a Fabry-Perot cavity, i.e. providing the waveguide 100 in the Fabry-Perot cavity between two reflectors. The length of the waveguide 100 may define a resonance wavelength, such that constructive interference of different multiples of reflections of the electro-magnetic wave in the Fabry-Perot cavity will occur at the resonance wavelength. For instance, if one of the reflectors is arranged to be partly transmissive to the electro-magnetic wave, the electro-magnetic wave output from the Fabry-Perot cavity will be highly dependent on whether the electro-magnetic wave has a wavelength corresponding to the resonance wavelength.

When the size of the gap 106 is changed, the refractive index of the waveguide 100 will change and the resonance wavelength defined by the Fabry-Perot cavity will also change. Hence, the intensity of an electro-magnetic wave output by the Fabry-Perot cavity may be related to whether the wavelength of the electro-magnetic wave corresponds to the resonance wavelength and may thus be a measure of a size of the deformation of the membrane 202.

The Fabry-Perot cavity may alternatively be formed to receive an electro-magnetic wave being coupled into the Fabry-Perot cavity from a waveguide passing in close vicinity of the Fabry-Perot cavity. An intensity of the electro-magnetic wave propagating in the waveguide passing the Fabry-Perot cavity will substantially decrease if the wavelength fits the wavelength of the Fabry-Perot cavity.

In another embodiment, the electro-magnetic resonator 210 may comprise a distributed Bragg reflector, i.e. two structures having different refractive index may be alternatingly arranged in a direction of propagation of the electro-magnetic wave. Hence, reflections may occur in interfaces between the two structures and constructive interference of different multiples of reflections of the electro-magnetic wave will occur at a resonance wavelength corresponding to an optical path within the structures. Thus, the distributed Bragg reflector may be designed to reflect an electro-magnetic wave in dependence on whether the electro-magnetic wave corresponds to a resonance wavelength of the distributed Bragg reflector.

The alternating structures in the distributed Bragg reflector may be formed by a height of the first waveguide part 102 being varied, such that the size of the gap 106, in an undeformed state of the membrane 202, varies in a direction of propagation of the electro-magnetic wave through the waveguide 100. Since the refractive index of the waveguide 100 is dependent on the size of the gap 106, the varying height of the first waveguide part 102 will form structures having different refractive indices so as to form the distributed Bragg reflector.

The alternating structures of the distributed Bragg reflector may alternatively be formed by varying the width of the first waveguide part 102, by having spacings between adjacent structures of the first waveguide part 102, or by varying a height of the second waveguide part 104.

When the membrane 202 is deformed, the size of the gap 106 may be changed for at least a plurality of the structures in the distributed Bragg reflector such that the refractive indices in the distributed Bragg reflector will also change and the resonance wavelength defined by the distributed Bragg reflector will also change. Hence, the intensity of an electro-magnetic wave output by the distributed Bragg reflector may be related to whether the wavelength of the electro-magnetic wave corresponds to the resonance wavelength and may thus be a measure of a size of the deformation of the membrane 202.

It should also be realized that distributed Bragg reflectors may be used as the reflectors for the Fabry-Perot cavity described above.

According to another embodiment, as illustrated in FIG. 4, the electro-magnetic resonator 210 may comprise a ring resonator. The electro-magnetic wave may be coupled into the ring resonator, by means of the ring resonator being arranged in close vicinity of a waveguide 100. In the embodiment shown in FIG. 4, the waveguide 100 discussed above is used for coupling the electro-magnetic wave into the ring resonator. However, it should be realized that the waveguide for coupling the electro-magnetic wave into the ring resonator may be formed in another shape and need for instance not even comprise two different parts.

However, in the embodiment shown in FIG. 4, the waveguide 100 as described above is used for propagating an electro-magnetic wave to the cavity. The ring resonator comprises a third waveguide part 212 which is patterned in the first plane (i.e. the same plane as the first waveguide part 102).

The third waveguide part 212 is arranged in relation to the second waveguide part 104 such that the third and second waveguide parts are spaced apart by a gap 214 in the second direction Z. The gap 214 has a size which is sufficiently small such that the third and second waveguide parts unitely form a single waveguide for guiding the electro-magnetic wave.

Similar to the discussion above for the waveguide 100, the third waveguide part 212 may be patterned in the first plane for defining a track along which an electro-magnetic wave will be guided. The second waveguide part 104 may have a large extension, such that a projection of the track defined by the third waveguide part 212 may fit within a rectangular portion of the second waveguide part 104 (i.e. the second waveguide part 104 need not be patterned to follow the track).

The third waveguide part 212 may define a track forming a closed loop. There are numerous alternatives of the shape of the closed loop. In an embodiment, the closed loop may define a circle. In another embodiment, the closed loop may be elliptic or oval. In yet another embodiment, the closed loop may be oblong having parallel straight lines connected by curved shapes at the ends, e.g. forming a racetrack-shaped loop.

Thus, the electro-magnetic resonator 210 may propagate an electro-magnetic wave along the closed loop, such that a constructive interference for a resonance wavelength $\lambda_m$ may be achieved if a path length of the closed loop corresponds to a multiple of a wavelength of the electro-magnetic wave in the electro-magnetic resonator 210, i.e. if $$m\lambda_m = n_e l,$$

where m is an integer number, $n_e$ is the effective refractive index of the electro-magnetic resonator 210 and l is the length of the loop.

Thus, if the size of the gap 106 between the third waveguide part 212 and the second waveguide part 104 is changed, the refractive index of the electro-magnetic resonator 210 is also changed so that the resonance wavelength for the electro-magnetic resonator 210 is changed.

The electro-magnetic wave may be transferred in a waveguide 100, which is arranged in the vicinity of the electro-magnetic resonator 210. The electro-magnetic wave may thus have a likelihood, e.g. due to an evanescent field, to be transferred into the electro-magnetic resonator 210. If the wavelength of the electro-magnetic wave corresponds to the resonance wavelength of the electro-magnetic resonator 210, the electro-magnetic wave will be strongly coupled into the electro-magnetic resonator 210 and a dip in intensity of the electro-magnetic wave being transferred in the waveguide 100 past the electro-magnetic resonator 210 may be observed.

It should also be realized that a second waveguide may be coupled to the electro-magnetic resonator 210 for reading out an electro-magnetic wave from the electro-magnetic resonator 210. The second waveguide may thus have a peak in transmission at the resonance wavelength of the electro-magnetic resonator 210.

Figure 6:
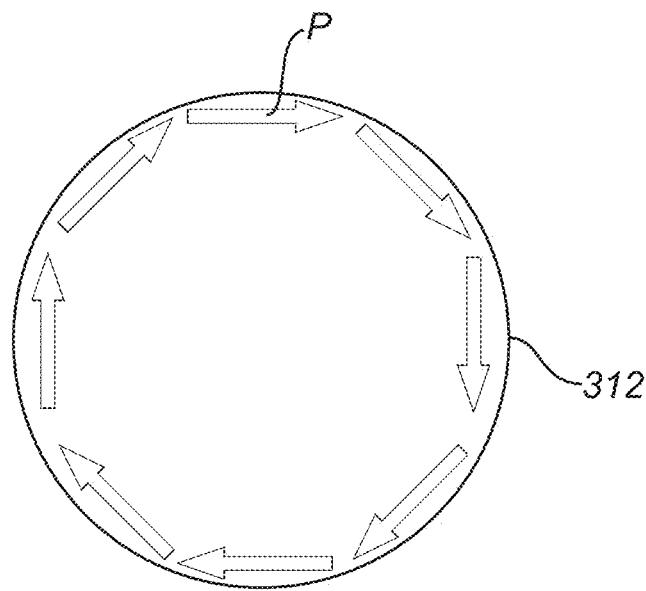
FIG. 6 is a schematic view of a waveguide part in an electro-magnetic resonator.

According to an alternative illustrated in FIG. 6, the third waveguide part may be formed with a shape forming a rounded sheet 312 in the first plane. Here, the rounded sheet 312 is illustrated as a disc 312, but the rounded sheet need not necessarily define a circular shape.

As shown by arrows P in FIG. 6, the electro-magnetic wave may be propagated along edges of the disc 312. Hence, the third waveguide part need not necessarily have a width which limits propagation of the electro-magnetic wave. Rather, a shape of the third waveguide part may force the electro-magnetic wave to follow the edge of the third waveguide part, such that the third waveguide part need not have a small width for controlling guiding of the electro-magnetic wave.

The pattern of a disc 312 or another shape of the rounded sheet may be easier to manufacture than patterning the track along which the electro-magnetic wave is to be propagated. Also, the disc 312 may be configured to have a smaller circumference for defining the closed loop, compared to the third waveguide part 212 being patterned to form the track.

The second waveguide part 104 may be arranged in the second plane to extend across the entire area defined by the disc 312, such that a projection of the disc 312 onto the second plane fits within a rectangular portion of the second waveguide part 104.

Referring now again to FIG. 4, the sensor 200 may comprise a laser source 220 for generating the electro-magnetic wave that is to be guided by the waveguide 100.

It should be realized that it is not necessary to use a laser source 220. Rather, a light source 220 which may provide a relatively narrow band of generated light may be used. For instance, a light-emitting diode (LED) may be used instead, possibly in combination with a spectral filter for forming a narrow band of generated light. Although it is in the following referred mainly to laser light, it should thus be understood that it may alternatively be another type of narrow band light.

Thus, laser light from the laser source 220 may be coupled into the waveguide 100 and be guided by the waveguide 100 past the electro-magnetic resonator 210. An intensity of the laser light propagating past the electro-magnetic resonator 210 will depend on the correspondence between the wavelength of the laser light and the resonance wavelength of the electro-magnetic resonator 210. Since the resonance wavelength of the electro-magnetic resonator 210 will be dependent on the deformation of the membrane 202, the intensity of the laser light in the waveguide 100 may provide a measure of the external force received by the membrane 202.

The sensor 200 may further comprise a detector 230, which may be configured to receive the electro-magnetic wave having propagated past the electro-magnetic resonator 210 in the waveguide 100. Thus, the electro-magnetic wave in the waveguide 100 may be coupled out of the waveguide 100 and received by the detector 230. The detector 230 may for instance comprise a photo-diode for detecting the intensity of the electro-magnetic wave.

The laser source 220 and the detector 230 may or may not be formed on a common sensor chip with the sensor 200.

Figure 7:
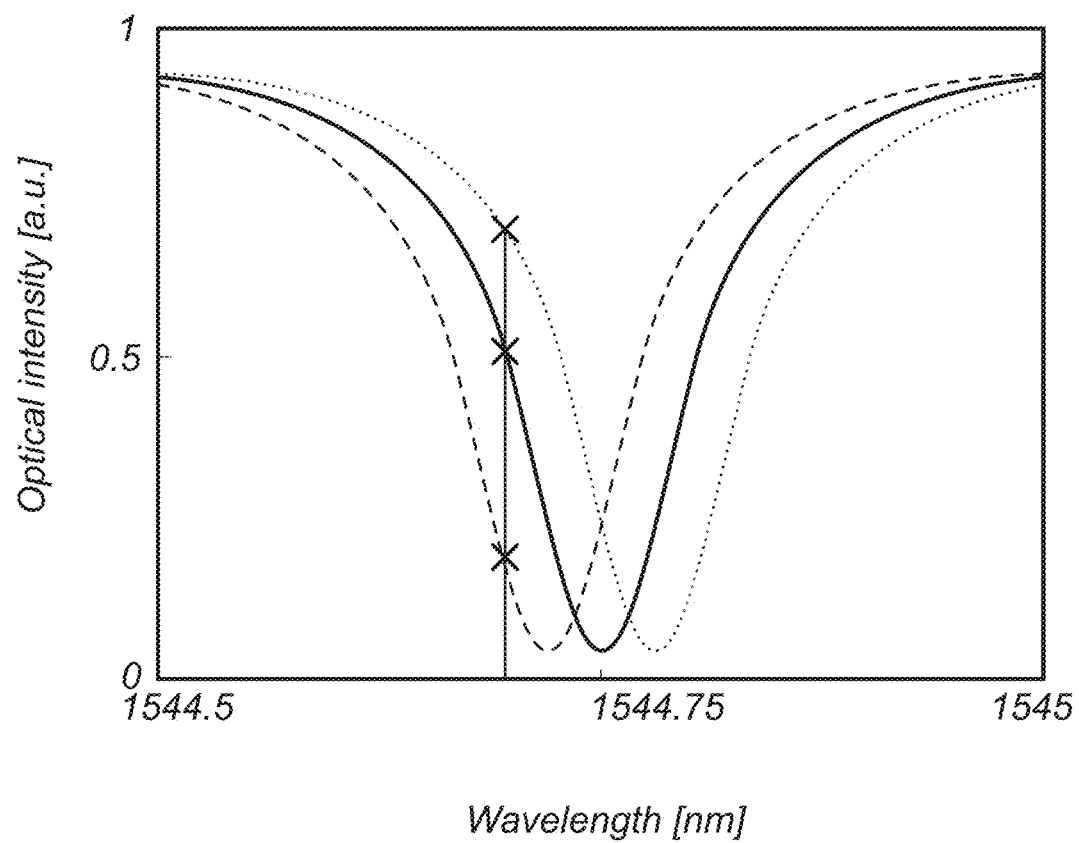
FIG. 7 is a graph of resonance curves for different sizes of a gap in the electro-magnetic resonator.

As illustrated in FIG. 7, the laser source 220 may be configured to generate laser light of a wavelength being arranged at a flank of a resonance curve of the electro-magnetic resonator 210. Thus, the laser source 220 may provide a measurement wavelength, which does not correspond exactly to the resonance wavelength of the electro-magnetic resonator 210 in an undeformed state of the membrane 202.

In the graph of FIG. 7, the intensity that would be measured by the detector 230 for different wavelengths of the laser light are illustrated. Three different resonance curves are illustrated for different effective refractive index of the electro-magnetic resonator 210. The peak resonance wavelength (and corresponding dip in intensity) is shifted in dependence of the change of refractive index.

Measurements are performed at a wavelength indicated by a straight line in the graph of FIG. 7 and the transmission of the wavelength is indicated by crosses and illustrates that, depending on the effective refractive index of the electro-magnetic resonator 210, the transmission will change.

The center resonance curve (solid line) illustrates the resonance wavelength of the electro-magnetic resonator in the undeformed state of the membrane 202. Since the measurement wavelength is selected to be arranged at a flank of the resonance curve, changes to increase a size of the gap 214 may be differentiated from changes to decrease the size of the gap 214.

If the size of the gap 214 is decreased, the resonance wavelength is shifted towards a shorter wavelength and, using the measurement wavelength illustrated in FIG. 7, the measurement wavelength is closer to the resonance wavelength (illustrated by the dashed line resonance curve), such that a lower intensity will be detected by the detector 230.

On the other hand, if the size of the gap 214 is increased, the resonance wavelength is shifted towards a longer wavelength and, using the measurement wavelength illustrated in FIG. 7, the measurement wavelength is farther away from the resonance wavelength (illustrated by the dotted line resonance curve), such that a lower intensity will be detected by the detector 230.

It should also be realized that a bandwidth of the light provided to the electro-magnetic resonator 210 may be larger than a width of the resonance curve. Similar to the description above, when a peak of the resonance wavelength is changed, an overlap between the resonance curve and the bandwidth of light is changed, which may be detected as a change in intensity.

Figure 8:
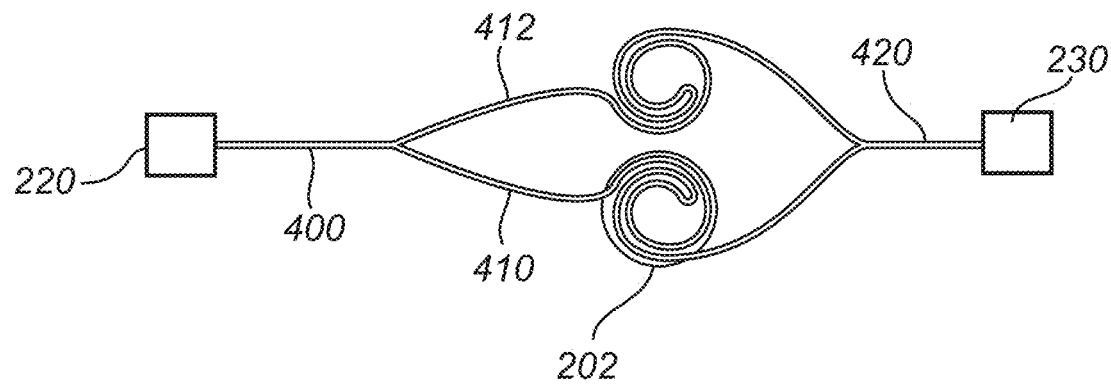
FIG. 8 is a schematic view of a Mach-Zehnder interferometer for sensing of a change of a size of a gap in the waveguide.

Referring now to FIG. 8, another embodiment for detecting a change of the size of the gap 106 of the waveguide 100 will be discussed.

In this embodiment, a Mach-Zehnder interferometer (MZI) is provided for detecting the phase shift. The electro-magnetic wave may thus be provided in a common input waveguide 400 and may be branched into a first branch 410 and a second branch 412, which are later re-joined in a common output waveguide 420 for re-combining the electro-magnetic waves having propagated through the first and second branches 410, 412 and a phase shift due to deformation of the membrane 202 may be measured in the re-combined electro-magnetic wave.

The first branch 410 of the MZI may be formed by the waveguide 100 and may extend through the cavity for being affected by a possible deformation of the membrane 202. The second branch 412 of the MZI may extend outside the cavity so as not to be affected by any deformation of the membrane 202 and to provide a reference.

The first and the second branches 410, 412 may have equal path lengths. The waveguide in second branch 412 may further be identical to the waveguide 100 in the first branch 410, i.e. the waveguide in the second branch 412 may also be formed by a first waveguide part and a second waveguide part separated by a gap. The gap in the waveguide of the second branch 412 may be filled by the same medium, such as air, as used for the waveguide in the first branch 410. However, according to an alternative, the first and second waveguide parts of the waveguide of the second branch 412 may be separated by an intermediate layer filling the gap. The intermediate layer may be designed to provide a similar refractive index as the medium in the gap 106 of the waveguide 100 of the first branch 410 so as to ensure that the waveguide in the second branch 412 provides identical propagation properties as the waveguide in the first branch 410 for an undeformed state of the membrane 202. The use of an intermediate layer filling the gap in the second branch 412 may provide for a simpler manufacturing of the second branch 412.

However, instead of having equal characteristics for the first and the second branches 410, 412, the length of the second branch 412 may be designed to provide an equal optical path length as will be provided by the first branch 410 in the undeformed state of the membrane 202. Also, the optical path lengths of the first and the second branches 410, 412 may be designed to differ in such manner that a sensitivity of the MZI to a change in effective refractive index of the first branch 410 is optimized.

When the first and second branches 410, 412 are joined in the common output waveguide, an interference will occur between the electro-magnetic waves having propagated in the two branches 410, 412. If the membrane 202 is undeformed, the electro-magnetic waves from the first and the second branches 410, 412 will be in phase and a constructive interference will occur. If the membrane 202 is deformed, the phase shift caused by the refractive index being changed for the waveguide 100 of the first branch 410 will cause destructive interference so as to lower intensity of an electro-magnetic wave propagating in the output waveguide 420. Thus, by detecting an intensity of the electro-magnetic wave, a measure of the deformation of the membrane 202 and hence the external force may be acquired.

The waveguide 100 of the first branch 410 may be shaped to form a long path through the cavity so as to increase sensitivity of the MZI to the deformation of the membrane 202. For instance, the waveguide 100 may be arranged to form one or more loops in the cavity. As discussed above, the waveguide in the second branch 412 may be similarly shaped in order to provide an equal path length of the second branch 412 as in the first branch 410 in the undeformed state of the membrane 202.

Although the laser source 220 and detector 230 are discussed above in relation to a sensor 200 comprising a ring resonator, it should be realized that similar detection of the change of the size of the gap in an electro-magnetic resonator 210 or in the waveguide 100, even if not formed as a resonator, may be performed for such embodiments.

The sensor 200 may be provided with a plurality of sensor elements. Hence, an array of sensor elements, each comprising a sensing area may be provided. Each sensor element may be implemented according to the description above. Further, each sensor element may be provided with a separate waveguide 100 for sensing of the force incident on the sensing area.

The array of sensor elements may be associated with a plurality of laser sources 210 and detectors 220, each sensor element being associated with its own laser source 210 and detector 220. The array of sensor elements may share connections to the laser sources 210 and detectors 220 and may comprise multiplexer(s) to selectively couple the electro-magnetic wave from a laser source 210 to the corresponding waveguide 100 of the sensor element associated with the laser source 210. Similarly, multiplexer(s) may be used to selectively couple the electro-magnetic wave form the waveguide 100 of any of the sensor elements to a corresponding detector 220. In a further alternative, the array of sensor elements may share a single laser source 210 and detector 220.

Referring now to FIGS. 9a-g, a method of manufacturing a waveguide 100 as described above will be described. The method of manufacturing of the waveguide 100 is particularly advantageous in providing an accurate control of a size of the gap 106, while the second waveguide part 104 is arranged on a cavity of a substantial height (in relation to the size of the gap).

The manufacturing method may start with a first wafer 500. The method is illustrated here using a silicon-on-insulator wafer 500, which may be useful in forming a silicon-based waveguide 100, but it should be realized that the waveguide 100 need not necessarily be formed on a silicon-on-insulator wafer 500.

Figure 9A:
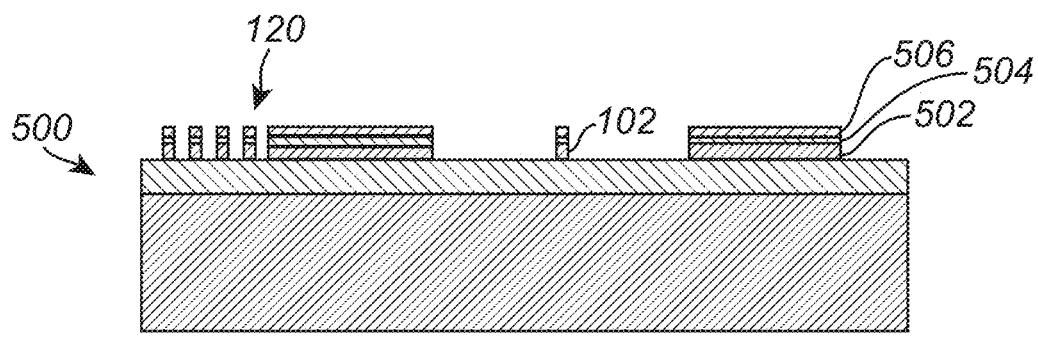
FIGS. 9a-g are cross-sectional views of a waveguide during different manufacturing steps for manufacturing the waveguide.

As illustrated in FIG. 9a, a first waveguide layer 502, a sacrificial layer 504 and a protection layer 506 may be formed on the first wafer 500.

The first waveguide layer 502 is here illustrated to be formed by Si, which may be suitable for use of the waveguide for guiding an electro-magnetic wave in the infrared range. A thickness of the first waveguide layer 502 is selected based on a desired thickness of the first waveguide part 102, which is to be formed by the first waveguide layer 502.

The sacrificial layer 504 may be formed as a $SiO_2$ layer.

A thickness of the sacrificial layer 504 is used for defining a size of the gap 106 of the waveguide 100. Thus, the sacrificial layer 504 may be deposited using an accurate control of the thickness, e.g. to form a thickness of the sacrificial layer 504 in a range of 10-100 nm.

The sacrificial layer 504 may be formed by thermal growth or by atomic layer deposition in order to control a thickness of the sacrificial layer 504.

The protection layer 506 may be formed as a SiN layer. Since a pattern is to be formed in the protection layer 506, the protection layer 506 may be deposited to be relatively thin so as to limit the thickness of the layer that is to be removed in patterning. For instance, a 100 nm thickness of the protection layer 506 may be deposited.

Then, the first waveguide layer 502, the sacrificial layer 504 and the protection layer 506 are patterned. The patterning may be performed e.g. using standard optical lithography.

The patterning of the first waveguide layer 502, the sacrificial layer 504 and the protection layer 506 is made in order to define the pattern of the first waveguide part 102 with a lateral spacing to supporting structures 112, also formed in the first waveguide layer 502. Hence, the patterning may define a trench, in which the first waveguide part 102 is arranged. As illustrated in FIG. 9a, the patterning may also define a cavity, with a relatively large spacing between the first waveguide part 102 and the supporting structures 112.

The patterning may also define a coupler 120 for coupling an electro-magnetic wave into or out of the waveguide 100. The coupler 120 is illustrated in FIGS. 9a-g at a left-hand side of the cross-section. This is done merely for enabling illustration of the coupler 120 in the figures and it should be realized that the portion of the coupler 120 illustrated in FIGS. 9a-g forms a length-wise cross-section of the waveguide 100 in a different portion of the waveguide 100 than the portion comprising the cross-section of the first waveguide part 102 arranged in the cavity.

Figure 9B:
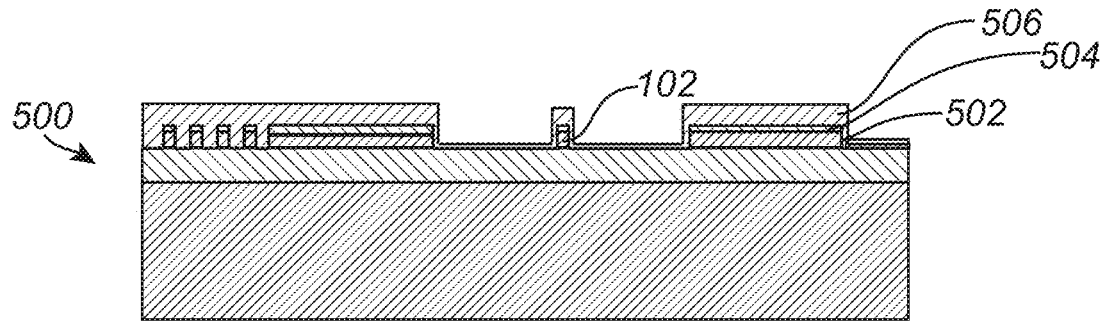

As illustrated in FIG. 9b, after patterning of the first waveguide layer 502, the sacrificial layer 504 and the protection layer 506, an additional deposition of protection layer material is performed. The deposition may be performed on the entire first wafer 500. The additional protection layer material may be useful in ensuring that the protection layer 506 may be completely removed in portions of the waveguide 100 in which the gap 106 is to be formed, while the protection layer 506 is to remain to protect the sacrificial layer 504 on the supporting structures 112.

The protection layer material may be deposited to add a 100 nm thickness to the protection layer 506. Hence, on etched areas in the patterning previously performed, a 100 nm thickness of the protection layer material is provided, whereas on non-etched areas a 200 nm thickness of the protection layer material is provided.

Figure 9C:
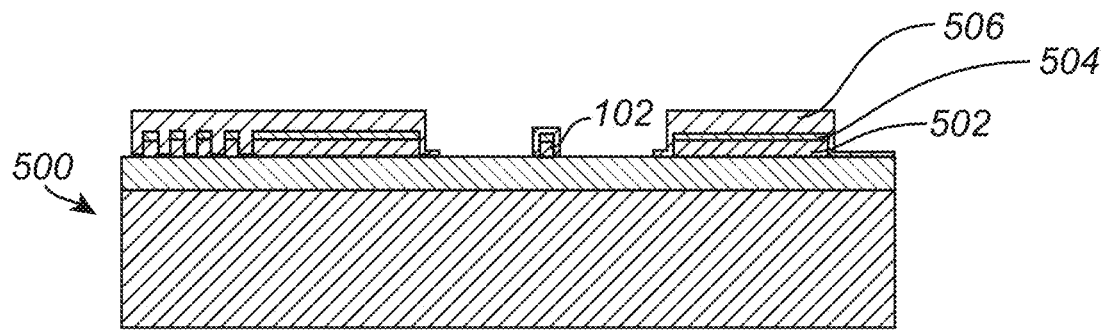

As illustrated in FIG. 9c, protection layer material is then selectively removed in an area of the waveguide 100 in which the gap 106 is to be formed, e.g. in the sensing area of the sensor 200.

This may comprise defining the area by a mask. For instance, the mask may be defined in a resist using optical lithography. Then, protection layer material may be removed in the area selected by the mask, e.g. by a dry etch, so as to remove a major portion of the protection layer material in the selected area. For instance, the dry etch may remove 150 nm of the protection layer material, leaving a thin layer of protection layer on the first waveguide part 102. After etching, a strip of the resist may be performed to remove the mask.

Figure 9D:
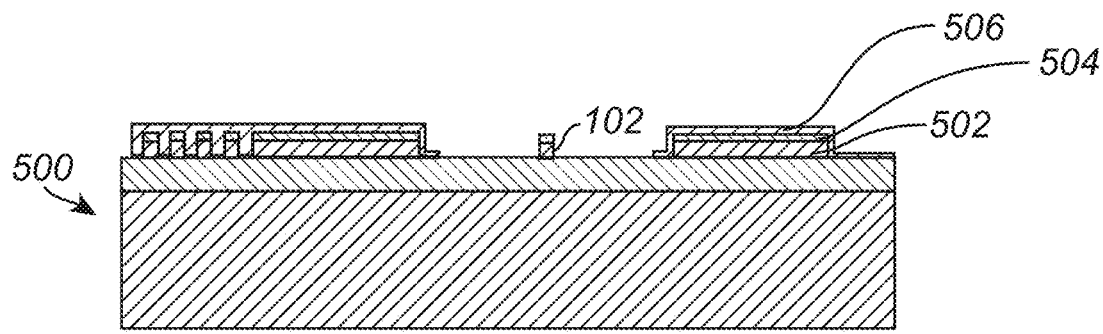

As illustrated in FIG. 9d, the protection layer 506 may then be selectively etched on the entire wafer 100. For instance, a wet etch may be performed to selectively etch the protection layer material. When the protection layer material is formed in SiN, a selective wet etch with $H_3PO_4$ may be applied.

The selective etching of the protection layer material may be performed to remove sufficient material of the protection layer 506 so as to expose the sacrificial layer 504 on the pattern of the first waveguide part 102 while the protection layer 506 still covers the sacrificial layer 506 on the supporting structure 112. For instance, the selective etching may be applied to etch 50 nm of the protection layer material so that the sacrificial layer 504 on the first waveguide part 102 is exposed while leaving the supporting structures 112 with a protection layer having a thickness of 150 nm.

Figure 9E:
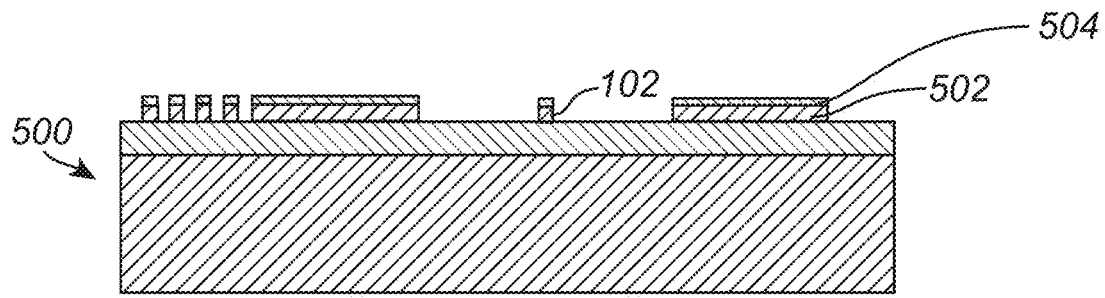

As illustrated in FIG. 9e, the sacrificial layer 504 may then be removed on the pattern of the first waveguide part 102. In other parts of the first waveguide layer 502 not forming the first waveguide part 102, e.g. the supporting structures 112, the sacrificial layer 504 is protected by the protection layer 506.

The sacrificial layer 504 may be removed using a wet etch which is selective to the sacrificial layer material. When the sacrificial layer material is formed in $SiO_2$, a selective wet etch with HF may be applied.

Then, the remaining protection layer 506 may be removed. This may again be performed using a wet etch to selectively etch the protection layer material. For instance, a selective wet etch with $H_3PO_4$ may be applied when the protection layer material is formed in SiN.

This implies, as illustrated in FIG. 9e, that a pattern of the first waveguide layer 502 is arranged on the first wafer 500 with a thin sacrificial layer 504 arranged on the first waveguide layer 502 in all portions of the first waveguide layer 502 except where the gap 106 is to be formed.

Separately from the processing of the first wafer 500 described above, a second wafer 510 is also prepared. The second wafer 510 may be prepared before, after, or in parallel with the above-described processing of the first wafer 500. The method is illustrated here using a second silicon-on-insulator wafer 510, which may be useful in forming a silicon-based waveguide 100, but it should be realized that the waveguide 100 need not necessarily be formed using a second silicon-on-insulator wafer 510.

The second wafer 510 comprises a second waveguide layer 512, which may define the second waveguide part 104. The second waveguide layer 512 may be patterned to form the second waveguide part 104. As discussed above, the second waveguide part 104 may have a large extension in relation to the first waveguide part 102 and may not require advanced patterning. For instance, the second waveguide layer 512 may be formed by a large rectangular portion.

The second wafer 510 may be provided with a plurality of second waveguide layers 512 in order to allow forming a plurality of waveguides 100 using the first and second wafers 500, 510. However, the wafers 500, 510 may be used to form only a single waveguide 100. In such case, the second waveguide layer 512 may not even need to be patterned, but may rather be a layer extending across the entire wafer 510.

The second waveguide layer 512 is here illustrated to be formed by Si, which may be suitable for use of the waveguide for guiding an electro-magnetic wave in the infrared range. A thickness of the second waveguide layer 512 is selected based on a desired thickness of the second waveguide part 104.

The second wafer 510 may be provided with a thin top bonding layer (not shown) on the entire second wafer 510. The top bonding layer may be formed by the same material as the sacrificial layer 504 for facilitating bonding of the wafers 500, 510.

Figure 9F:
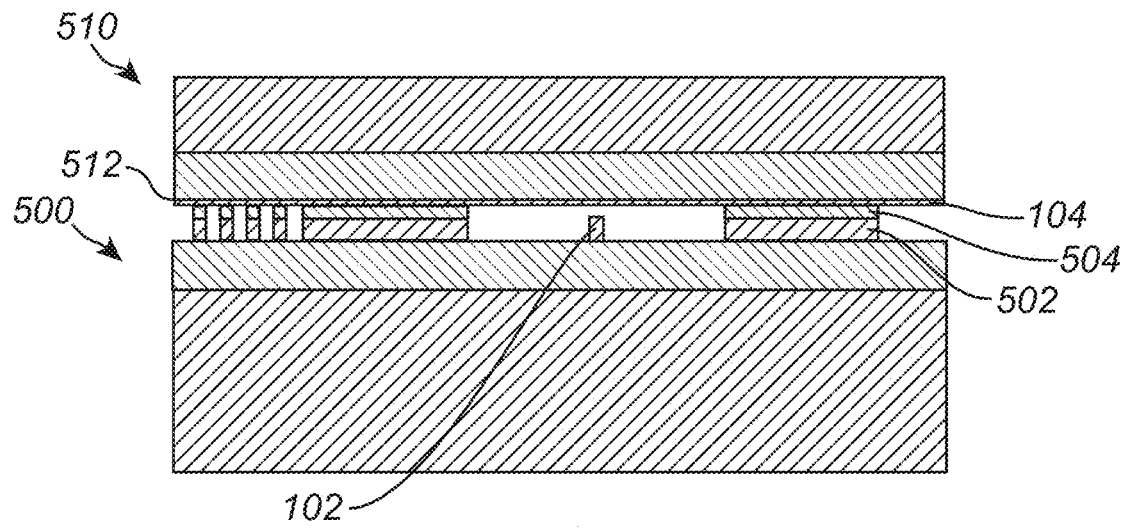

As illustrated in FIG. 9f, the second wafer 510 may be flipped and the first and second wafers 500, 510 may be bonded. Thus, the second wafer 510 may be bonded to the sacrificial layer 504 of the first wafer 510. This implies that the second waveguide part 104 may be arranged to be supported by the supporting structures 112 provided with the sacrificial layer 504. The second waveguide part 104 may further extend above the first waveguide part 102 but will be arranged spaced apart from the first waveguide part 102 by a gap 106 having a thickness corresponding to a thickness of the sacrificial layer 504.

The top bonding layer on the second wafer 510 may be very thin. For instance, a 5 nm thick bonding layer of $SiO_2$ may be formed to facilitate oxide-oxide wafer bonding.

The top bonding layer may extend over the entire wafer 510, such that the gap 106 between the first waveguide part 102 and the second waveguide part 104 may still correspond to a thickness of the sacrificial layer 504, as there will also be a thin top bonding layer on the second waveguide part 104 between the second waveguide part 104 and the first waveguide part 102.

Although the sacrificial layer 504 is disclosed above to be formed from $SiO_2$, it should be realized that the sacrificial layer 504 may be formed from another material, which allows for bonding of the first and second wafers 500, 510 through the material of the sacrificial layer 504. Also, the material of the sacrificial layer 504 is preferably highly etch selective towards the material of the first waveguide layer 502, such that the sacrificial layer 504 may be removed on the pattern of the first waveguide part 102 without affecting the first waveguide part 102.

As another alternative, the top bonding layer may be patterned on the second wafer 510 to be arranged only in portions which are to be bonded on the supporting structure 112. This may imply that the top bonding layer of the second wafer 510 will also contribute to a size of the gap 106 and, hence, a thickness of the top bonding layer may need to be very accurately controlled. This may imply that the gap 106 may not be formed to have a thickness as small as 15 nm, but still a very thin gap 106 may be formed. Also, it may require accurately aligning the wafers 500, 510 for bonding, which may make manufacturing more complicated.

Figure 9G:
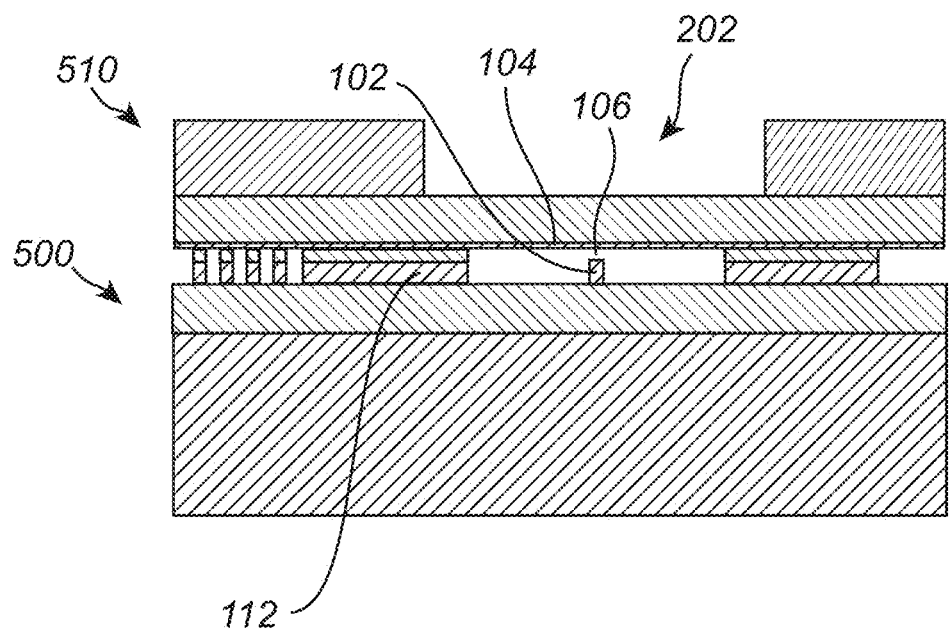

As illustrated in FIG. 9g, after bonding of the first and the second wafers 500, 510, the membrane 202 may be formed on the sensing area. This may be done on either side of the bonded wafers 500, 510, such that the membrane 202 may either be formed in the first wafer 500 or in the second wafer 510. Below, the forming of the membrane 202 is discussed as being formed in the second wafer 510, but it should be understood that the forming of the membrane 202 may be performed in the same manner by processing the first wafer 500 instead.

First, the entire second wafer 510 may be thinned down. Thus, the second wafer 510 may be thinned to a thickness of e.g. 15-20 μm.

Then, the second wafer 510 may be patterned in order to form the membrane 202. For instance, an optical lithography may be used for defining an area in which the membrane 202 is to be formed and then a deep Si etch of the wafer 510 may be performed to selectively remove material of the second wafer 500 so as to form the membrane 202 in the sensing area.

It should be realized that the patterning of the first waveguide part 102 as described above may also be used to form a pattern used in the electro-magnetic resonator 210, such as patterning to form the third waveguide part 212.

The description above is mainly made with regard to using the waveguide 100 in a sensor 200 for sensing an external force which may change a size of the gap 106 of the waveguide 100. However, it should be realized that the waveguide 100 may be used in other applications as well.

It should be realized that the sensor 200 illustrated in FIG. 4 may be used for sensing a change in any property of the gap 106. Thus, instead of sensing a change in a size of the gap 106, the sensor 200 may be used for sensing any change that affects the effective refractive index of the waveguide 100.

For instance, if a substance present in the gap 106 is changed and/or if an electro-magnetic property of the substance present in the gap 106 is changed, this may cause a change in refractive index of the gap 106, such that the effective refractive index of the waveguide 100 is changed.

The effect of a change of a substance or medium present in the gap 106 may be used for sensing of a gas, liquid or particles in the gap 106.

A functionalized surface of one or more of the first and second waveguide parts 102, 104 facing the gap 106 may be provided in order to cause a particle or substance of interest to selectively bio-chemically bind to the functionalized surface, so as to create a change in refractive index which may be detected. The arrangement of a particle or substance of interest to bind to the functionalized surface may alternatively be detected through absorption spectroscopy using the sensor 200.

The sensor 200 may be configured to provide a flow through the gap 106 along the first direction Y so as to allow detection of changes in the flow (e.g. for particle sensing in the flow).

According to another embodiment, the sensor 200 may be used in fluorescence or Raman spectroscopy, wherein the waveguide 100 may be used for efficiently providing excitation light, by means of the high electric field in the gap 106 and for efficiently guiding the fluorescent or Raman scattered light for detection.

Figure 10:
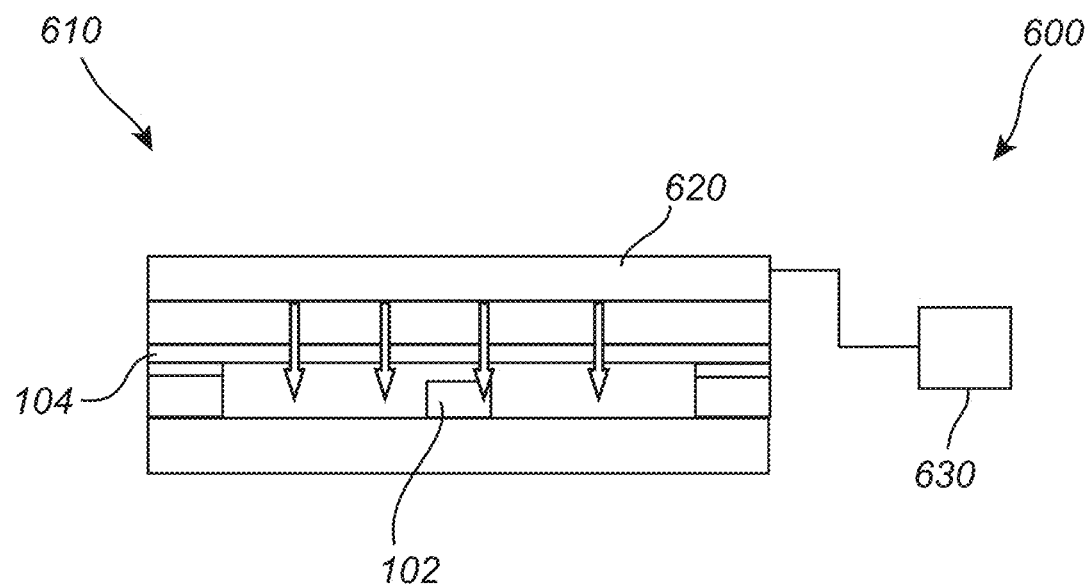
FIG. 10 is a schematic view illustrating a photonic integrated circuit using the waveguide.

The waveguide 100 need not even be used in association with any sensor. Referring now to FIG. 10, the use of the waveguide 100 in a photonic integrated circuit 600 will be described.

The photonic integrated circuit 600 may be used for providing functions, e.g. for controlling information signals being transferred by electro-magnetic waves. The waveguide 100 may be used as a component 610 in a photonic integrated circuit 600, wherein controlling of a property of the gap 106 may be used for accurately controlling an electro-magnetic wave propagated by the waveguide 100 so as to provide a function of the photonic integrated circuit 600.

In FIG. 10, a cross-section of the waveguide 100 is illustrated in an actuating area of the photonic integrated circuit component 610. The actuating area may comprise a cavity similar to the cavity discussed above in the sensing area of the sensor 200.

The photonic integrated circuit component 610 may further comprise an actuator 620, which may e.g. be arranged on the second waveguide part 104 as illustrated in FIG. 10. However, according to an alternative, the actuator 620 may be arranged below the first waveguide part 102 or the actuator 620 may comprise parts arranged on opposite sides of the first and second waveguide parts 102, 104.

The actuator 620 may be configured to provide a force for changing a size of the gap 106 so as to change propagation properties of the waveguide 100.

According to an embodiment, the actuator 620 may be configured to cause a change in the size of the gap 106 based on providing an electrostatic force so as to force the first and second waveguide parts 102, 104 towards or away from each other.

According to another embodiment, the actuator 620 may be configured to cause a change in the size of the gap 106 by thermal control, which may be based on an electrical signal. Hence, a temperature of the actuator 620 may be locally changed or the actuator 620 may cause the temperature of another structure, such as a membrane on which the second waveguide part 104 is arranged, to locally change. The changed temperature may cause expansion or contraction of the structure for changing the size of the gap 106.

According to another embodiment, the actuator 620 may be configured to cause a change in the size of the gap 106 using a piezoelectric effect to deform the actuator 620 or another structure, such as a membrane on which the second waveguide part 104 is arranged.

According to yet another embodiment, the actuator 620 may be configured to cause a change in the size of the gap 106 based on providing a pressure wave, such as an acoustic wave, onto a membrane. The incident pressure wave may thus cause the membrane on which the second waveguide part 104 is arranged to be deformed for changing a size of the gap 106.

The photonic integrated circuit 600 may further comprise a controller 630, which may be configured to control functions of the photonic integrated circuit 600. The controller 630 may thus be configured to send a control signal to the actuator 620 for actuating a change in the property of the gap 106 so as to control the function of the waveguide 100 of the photonic integrated circuit component 610. The control signal may be provided as an electric signal, which may facilitate controlling of the actuator 620.

The photonic integrated circuit component 610 using the waveguide 100 may be used for providing a desired function of a photonic integrated circuit 600.

For instance, the photonic integrated circuit component 610 may be used for modulating the electro-magnetic wave in the waveguide, as a phase shifter for causing a phase shift of the electro-magnetic wave in the waveguide, or as a switch, such as a single pole double throw switch or a single pole single throw switch, or as an optical filter.

Figure 11:
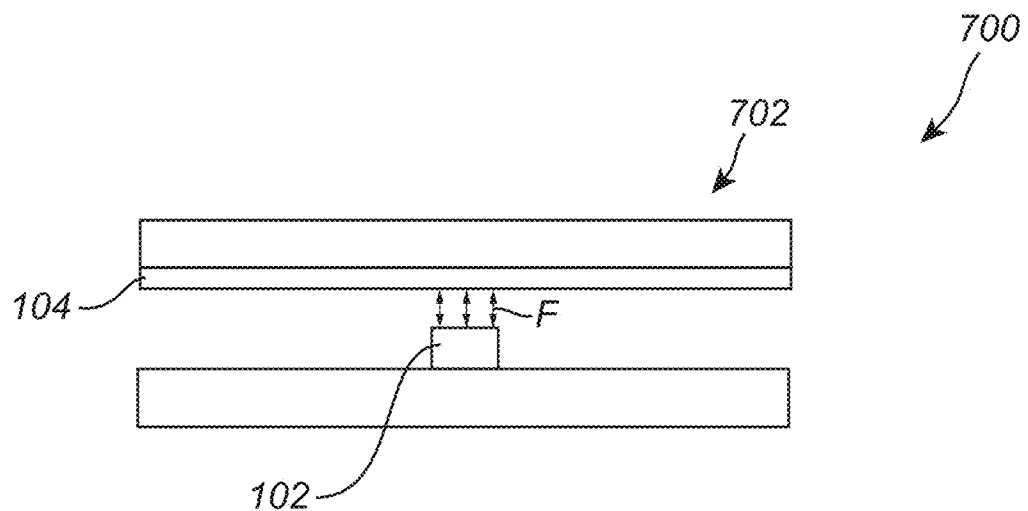
FIG. 11 is a schematic view of an actuator using the waveguide.

Referring now to FIG. 11, the use of the waveguide 100 as an actuator 700 will be described.

The waveguide 100 may thus be integrated in an actuator 700, such that the electro-magnetic wave propagated in the waveguide 100 may be used for causing a force, which may be used in the actuator 700.

In FIG. 11, a cross-section of the waveguide 100 is illustrated in an actuating area of the actuator 700.

The electro-magnetic wave in the waveguide 100 may cause a strong electro-magnetic field in the gap 106. This electro-magnetic field may be associated with a force, which may act to push on the first waveguide part 102 and/or the second waveguide part 104. Thus, the force may cause a tiny movement of the first and/or second waveguide part 102, 104, which be used e.g. in study of interaction between electro-magnetic waves and matter.

The electro-magnetic wave in the waveguide 100 may alternatively cause a heating of the waveguide 100 and/or a surrounding medium. The heating may thus cause movement of a physical structure, e.g. for causing a movement of a membrane 702, as illustrated by arrows F in FIG. 11. Thus, the actuator 700 may be used for causing the membrane to vibrate and output a pressure wave, such that the actuator may be used as a loudspeaker or as an ultrasound source.

According to another embodiment, the electro-magnetic field in the gap 106 may be used as an optical tweezer. The electro-magnetic wave in the waveguide 100 may provide an attractive force in the gap, depending on a relative refractive index between a particle and surrounding medium. Thus, the actuator may be used for holding and/or moving particles in the gap 106 using electro-magnetic waves being propagated in the waveguide 100.

The actuator may further be configured to enable changing of a size of the gap 106. This may be used for changing a strength with which a particle is held, when the actuator functions as an optical tweezer.

Thus, the electro-magnetic wave in the waveguide 100 may be used to trigger the actuator 700. The actuator 700 may thus be controlled by the electro-magnetic wave being propagated through the waveguide 100. Hence, by controlling coupling of electro-magnetic waves into the waveguide 100, the actuator 700 may be controlled.

According to yet another embodiment, the waveguide 100 may be used for delivery of an electro-magnetic wave to a desired position.

The strong electro-magnetic field available in the gap 106 may be used for efficiently irradiating a particle or substance in the gap 106. This may be combined with sensing of interaction by the electro-magnetic wave with the particle or substance in the gap 106.

This may be of particular interest to be used in applications using fluorescence or Raman spectroscopy, as the waveguide 100 may efficiently guide excitation light to excite particles and may efficiently guide fluorescent or Raman scattered light to detection.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method for manufacturing of a waveguide for guiding an electro-magnetic wave, said method comprising:

forming a first waveguide layer, a sacrificial layer and a protection layer on a first wafer, the sacrificial layer being formed so as to provide a constant thickness of the sacrificial layer on the entire wafer;

patterning the first waveguide layer, the sacrificial layer and the protection layer so as to define a pattern of a first waveguide part in the first waveguide layer, the sacrificial layer and the protection layer to form a lateral spacing between the pattern of the first waveguide part and a supporting structure in the first waveguide layer;

selectively removing protection layer material from the first waveguide part using a mask and then selectively etching the protection layer on the entire wafer to expose the sacrificial layer on the pattern of the first waveguide part while the protection layer still covers the sacrificial layer on the supporting structure;

removing the sacrificial layer on the pattern of the first waveguide part;

removing the protection layer;

bonding a second wafer on the first wafer, the second wafer comprising a second waveguide part in a second waveguide layer, wherein the first and the second wafers are bonded by bonding the second wafer to the sacrificial layer of the first wafer such that the second waveguide part is supported by the supporting structure and a gap corresponding to the thickness of the sacrificial layer is formed between the first waveguide part and the second waveguide part and the first and second waveguide parts unitely form a single waveguide for guiding the electro-magnetic wave.

2. The method according to claim 1, wherein the first waveguide part has a first width in a first direction perpendicular to a direction along which an electro-magnetic wave will be propagated in the waveguide and the second waveguide part has a second width in the first direction, wherein the second width is larger than the first width.

3. The method according to claim 1, wherein the second waveguide layer forms a wide slab, which is configured to extend between supporting structures on opposite sides of the patterned first waveguide part when the first and second wafers are bonded.

4. The method according to claim 1, wherein the sacrificial layer is formed to have a thickness corresponding to half a wavelength, preferably smaller than a hundredth of a wavelength, of the electro-magnetic wave to be guided by the waveguide.

5. The method according to claim 1, further comprising after bonding the second wafer on the first wafer, selectively removing material of the second wafer to form a thin structure above the first waveguide part.

6. The method according to claim 1, wherein the sacrificial layer is formed by thermal growth or by atomic layer deposition.

7. The method according to claim 1, further comprising, before said selectively removing protection layer material and after said patterning, depositing protection layer material on the first wafer.

8. The method according to claim 1, wherein said selectively removing of protection layer material comprises defining the mask by optical lithography, selectively etching the protection layer in the area defined by the mask using a dry etch, and removing the mask.

9. The method according to claim 1, wherein said selectively etching the protection layer comprises etching using a wet etch selective to the protection layer material.

10. The method according to claim 1, wherein said removing of the sacrificial layer comprises etching using a wet etch selective to sacrificial layer material.

11. The method according to claim 1, wherein said removing of the protection layer comprises etching using a wet etch selective to the protection layer material.

12. The method according to claim 1, wherein said patterning of the first waveguide layer, the sacrificial layer and the protection layer further defines a third waveguide part in the first waveguide layer, wherein the first and the second wafers are bonded by bonding the second wafer to the sacrificial layer of the first wafer such that the second waveguide part is supported by the supporting structure and a gap corresponding to the thickness of the sacrificial layer is formed between the third waveguide part and the second waveguide part and the second and third waveguide parts unitely form a single waveguide for guiding an electro-magnetic wave in a closed loop in a plane parallel to the first wafer.

13. The method according to claim 1, wherein the first and second waveguide layers are formed by silicon or silicon nitride, and the sacrificial layer is formed by silicon dioxide.

14. The method according to claim 1, wherein the second wafer comprises a top bonding layer, wherein the first and the second wafers are bonded by bonding of the bonding layer of the second wafer to the sacrificial layer of the first wafer.

* * * * *